United States Patent [19]
Rostoker et al.

[11] Patent Number: 5,434,750
[45] Date of Patent: Jul. 18, 1995

[54] PARTIALLY-MOLDED, PCB CHIP CARRIER PACKAGE FOR CERTAIN NON-SQUARE DIE SHAPES

[75] Inventors: Michael D. Rostoker, San Jose; Chok J. Chia, Campbell; Seng-Sooi Lim, San Jose, all of Calif.

[73] Assignee: LSI Logic Corporation, Milpitas, Calif.

[21] Appl. No.: 79,499

[22] Filed: Jun. 18, 1993

Related U.S. Application Data

[63] Continuation-in-part of Ser. No. 834,182, Feb. 7, 1992, and a continuation-in-part of Ser. No. 933,430, Aug. 21, 1992.

[51] Int. Cl.$^6$ .................................................. H05K 1/11
[52] U.S. Cl. .................................... 361/784; 257/666; 257/678; 257/787; 257/707; 361/717; 361/728; 361/764; 361/813
[58] Field of Search .................. 174/16.3, 52.2, 52.4; 257/666-679, 700, 724, 730, 737, 787, 793, 796-797; 361/704, 709, 717, 728, 761, 764, 774, 776, 784, 792; 439/55, 68, 70

[56] References Cited

U.S. PATENT DOCUMENTS

| | | | |
|---|---|---|---|
| 3,405,441 | 10/1968 | Asher et al. | 29/627 |
| 3,429,040 | 2/1969 | Miller | 20/626 |
| 3,701,451 | 10/1972 | Schindler et al. | 220/27 |
| 3,811,186 | 5/1974 | Larnerd et al. | 29/626 |
| 3,871,014 | 3/1975 | King et al. | 357/67 |
| 3,909,838 | 9/1975 | Beyerlein | 357/70 |
| 3,984,860 | 10/1976 | Logue | 357/68 |
| 4,080,512 | 3/1978 | Ramet et al. | 174/68.5 |
| 4,100,566 | 7/1978 | Okikawa et al. | 357/70 |
| 4,120,020 | 10/1978 | Uden et al. | 361/386 |
| 4,141,030 | 2/1979 | Eisele et al. | 357/79 |
| 4,143,456 | 3/1979 | Inoue | 29/588 |
| 4,190,855 | 2/1980 | Inoue | 357/80 |
| 4,195,193 | 3/1980 | Grabbe et al. | 174/52 FP |
| 4,258,381 | 3/1981 | Inaba | 357/70 |
| 4,264,917 | 4/1981 | Ugon | 357/74 |
| 4,300,153 | 11/1981 | Hayakawa et al. | 357/80 |
| 4,330,790 | 5/1982 | Burns | 357/70 |

(List continued on next page.)

FOREIGN PATENT DOCUMENTS

| | | |
|---|---|---|
| 57-210638(A) | 12/1982 | Japan . |
| 58-128754(A) | 8/1983 | Japan . |
| 59-117244(A) | 7/1984 | Japan . |
| 60-49638(A) | 3/1985 | Japan . |
| 61-142750(A) | 6/1986 | Japan . |
| 61-145838(A) | 7/1986 | Japan . |
| 63-239827(A) | 10/1988 | Japan . |
| 63-268418(A) | 11/1988 | Japan . |
| 1-73753(A) | 3/1989 | Japan . |
| 2-128453 | 5/1990 | Japan . |
| WO92/11654 | 7/1992 | WIPO . |

OTHER PUBLICATIONS

"LED Array Modules by New Technology Microbump Bonding Method", by Hatada et al., IEEE Transactions on Components, vol. 13, No. 3, Sep. 1990, pp. 521–527.

"Overmolded Plastic Pad Array Carriers (OMPAC)", by Freyman et al., IEEE, 1991, pp. 176–182.

"Pad Array Improves Density", Electronic Packaging & Production, May 1992, pp. 25–26.

Primary Examiner—Gregory D. Thompson

[57] ABSTRACT

A dambar-less leadframe is sandwiched between two printed circuit boards (PCBs). The PCBs form a major portion of the package body, and isolate the leadframe leads from plastic molding compound. In one embodiment, an upper PCB (substrate) is formed as a ring, having an opening containing a heat sink element. A lower PCB is also formed as a ring, and has a smaller opening for receiving a die. The back face of the die is mounted to the heat sink. The exposed front face of the die is wire bonded to inner ends of conductive traces on the exposed face of the lower PCB. The outer ends of the traces are electrically connected to the leadframe leads by plated-through vias extending through the two PCBs. The plated-through vias additionally secure the sandwich structure together. Plastic molding compound is injection/transfer molded over the front face of the die and the bond wires, forming a partially-molded package. In another embodiment, the upper PCB is a solid planar element. The back face of the die is mounted to the inside surface of the upper PCB. The die, die-receiving area, and/or package body shape have a "certain non-square" shape (i.e., triangle, trapezoid, parallelogram, greatly-elongated rectangle, etc.).

18 Claims, 17 Drawing Sheets

U.S. PATENT DOCUMENTS

| | | | |
|---|---|---|---|
| 4,340,902 | 7/1982 | Honda et al. | 357/74 |
| 4,355,463 | 10/1982 | Burns | 29/827 |
| 4,363,076 | 12/1982 | McIver | 361/386 |
| 4,396,935 | 8/1983 | Schuck | 357/74 |
| 4,408,218 | 10/1983 | Grabbe | 357/70 |
| 4,460,537 | 7/1984 | Heinle | 264/272.17 |
| 4,507,675 | 3/1985 | Fujii et al. | 357/70 |
| 4,545,610 | 10/1985 | Lakritz et al. | 29/589 |
| 4,587,550 | 5/1986 | Matsuda | 357/79 |
| 4,594,770 | 6/1986 | Butt | 29/588 |
| 4,620,215 | 10/1986 | Lee | 357/81 |
| 4,631,805 | 12/1986 | Olsen et al. | 29/588 |
| 4,680,617 | 7/1987 | Ross | 357/72 |
| 4,688,152 | 8/1987 | Chia | 361/408 |
| 4,700,276 | 10/1987 | Freyman et al. | 361/403 |
| 4,700,473 | 10/1987 | Freyman et al. | 29/846 |
| 4,705,917 | 11/1987 | Gates, Jr. et al. | 174/52 FP |
| 4,717,066 | 1/1988 | Goldenberg et al. | 228/179 |
| 4,763,188 | 8/1988 | Johnson | 357/74 |
| 4,771,330 | 9/1988 | Long | 357/80 |
| 4,772,936 | 9/1988 | Reding et al. | 357/80 |
| 4,800,419 | 1/1989 | Long et al. | 357/70 |
| 4,803,546 | 2/1989 | Sugimoto et al. | 357/81 |
| 4,825,284 | 4/1989 | Soga et al. | 357/80 |
| 4,857,483 | 8/1989 | Steffen et al. | 437/209 |
| 4,868,349 | 9/1989 | Chia | 174/52.4 |
| 4,872,825 | 10/1989 | Ross | 425/117 |
| 4,874,722 | 10/1989 | Bednarz et al. | 437/209 |
| 4,890,152 | 12/1989 | Hirata et al. | 357/72 |
| 4,890,194 | 12/1989 | Derryberry et al. | 361/386 |
| 4,913,930 | 4/1990 | Getson | 427/58 |
| 4,926,241 | 5/1990 | Carey | 357/75 |
| 4,933,741 | 6/1990 | Schroeder | 357/70 |
| 4,935,581 | 6/1990 | Komathu | 174/52.4 |
| 4,949,225 | 8/1990 | Sagisaka et al. | 361/414 |
| 4,955,132 | 9/1990 | Ozawa | 29/840 |
| 4,961,105 | 10/1990 | Yamamoto | 357/72 |
| 4,965,702 | 10/1990 | Lott et al. | 361/401 |
| 4,970,575 | 11/1990 | Soga et al. | 357/72 |
| 4,970,577 | 11/1990 | Ogihara et al. | 357/74 |
| 4,972,253 | 11/1990 | Palino et al. | 357/74 |
| 4,974,057 | 11/1990 | Tazima | 357/72 |
| 4,975,765 | 12/1990 | Ackermann et al. | 357/80 |
| 4,982,265 | 1/1991 | Watanabe et al. | 357/75 |
| 4,984,059 | 1/1991 | Kubota et al. | 357/68 |
| 4,985,748 | 1/1991 | Belanger, Jr. | 357/69 |
| 4,996,587 | 2/1991 | Hinrichsmeyer et al. | 357/74 |
| 5,006,673 | 4/1991 | Freyman et al. | 174/255 |
| 5,006,919 | 4/1991 | Disko | 357/72 |
| 5,012,386 | 4/1991 | McShane et al. | 361/386 |
| 5,025,114 | 6/1991 | Braden | 174/52.4 |
| 5,031,069 | 7/1991 | Anderson | 361/321 |
| 5,047,837 | 9/1991 | Kitano et al. | 357/81 |
| 5,048,166 | 9/1991 | Wakamatsu | 29/830 |
| 5,051,807 | 9/1991 | Morozumi | 357/40 |
| 5,077,633 | 12/1991 | Freyman et al. | 361/403 |
| 5,111,279 | 5/1992 | Pasch et al. | 357/81 |
| 5,153,379 | 10/1992 | Guzuk et al. | 174/35 R |
| 5,153,385 | 10/1992 | Juskey et al. | 174/260 |
| 5,172,303 | 12/1992 | Bernardoni et al. | 361/396 |
| 5,195,023 | 3/1993 | Manzione et al. | 361/392 |
| 5,216,278 | 6/1993 | Lin et al. | 257/688 |

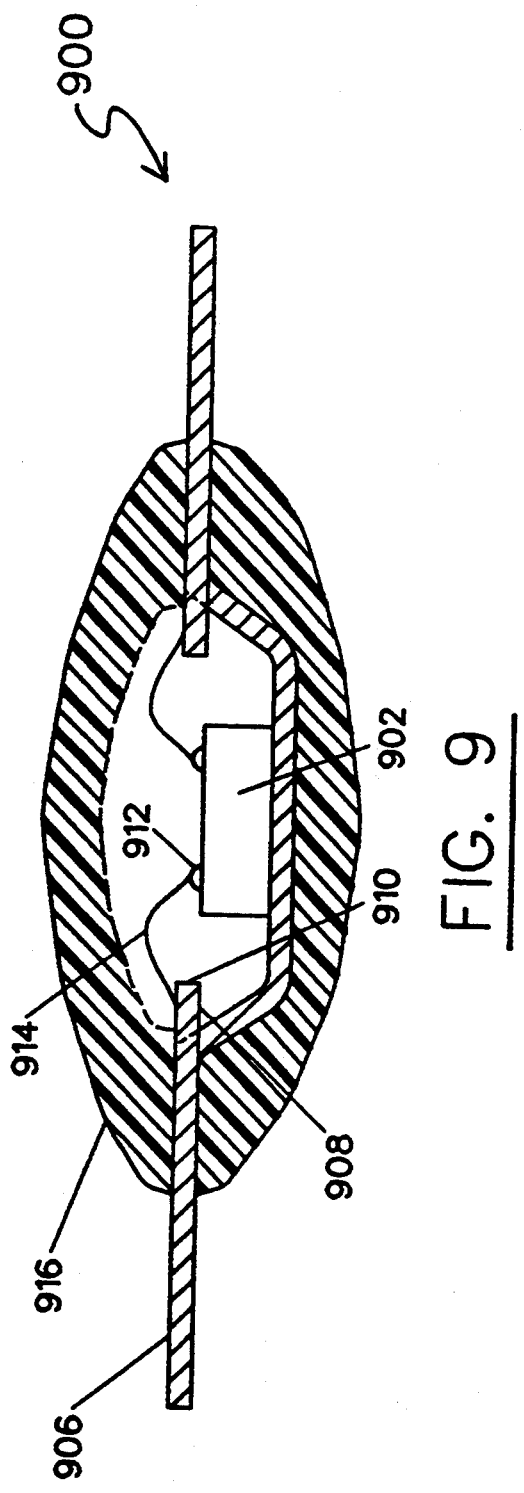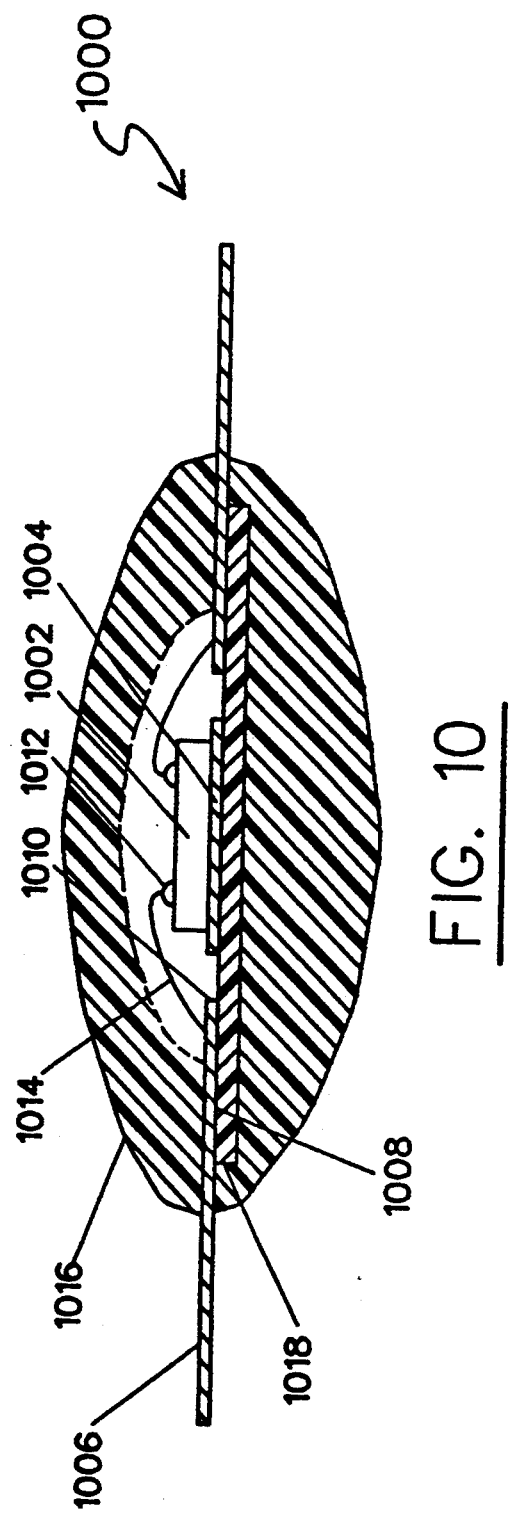

PARTIALLY-MOLDED, PCB CHIP CARRIER PACKAGE FOR CERTAIN NON-SQUARE DIE SHAPES

CROSS-REFERENCE TO RELATED APPLICATIONS

This is a continuation-in-part of commonly-owned, co-pending U.S. patent application Ser. No. 07/834,182 filed Feb. 7, 1992 by Chia and Lim, and is a continuation-in-part of commonly-owned, co-pending U.S. patent application Ser. No. 07/933,430, filed Aug. 21, 1992 by Michael D. Rostoker.

TECHNICAL FIELD OF THE INVENTION

The invention relates to the packaging of integrated circuit (IC) semiconductor devices (chips), especially to high pin count packages formed by injection or transfer molding.

BACKGROUND OF THE INVENTION

Packages provide the interconnect from a chip to a printed circuit board (PCB). The package also provides protection for the chip from the environment. The overall objective of the package design is to provide these features at the lowest possible manufacturing cost.

A common process employed in semiconductor packaging is wire bonding, wherein a fine wire is connected between semiconductor die pads and inner ends of package lead fingers.

In one packaging scheme, a semiconductor die is mounted within an opening in a package having external leads (or pins). Bond pads on the die are wired to terminals within the package, and a lid is mounted over the opening containing the die. This type of package is usually formed of ceramic, and is relatively expensive to manufacture.

Another technique for packaging integrated circuit devices is mounting the die to a die attach pad on a lead frame, connecting the die to various inner lead fingers of the lead frame, and encapsulating the die, either with epoxy or with a plastic molding compound. Plastic packages are preferred by most commercial users for their low cost and low weight. Plastic packaging is discussed in the main, hereinafter.

As chips become more complex, their packages require more pins (or external leads), and hence become larger in size. Transfer molding large plastic packages involves the transfer of large amounts of melted plastic, and the injection of the plastic can cause bond wires connecting the chip to the leadframe to move and short against each other (wire sweep). Also, because of the set cure characteristics of plastic molding compound, a large molded body has a tendency to warp, causing difficulties when packages are mounted to a PCB.

Molding the entire package body ("fully molded") usually requires that the leadframe has a "dambar", namely a continuous ring of metal surrounding the body that prevents the plastic from flowing out of the mold cavity between the external leads of the leadframe. The dambar then has to be removed to isolate individual leads before the package is usable. With high pin count packages, the leads are often delicate and spaced closely (fine pitch), resulting in the need for very fine precision tooling for the trimming operation. This type of tooling is also very expensive, which adds to the overall cost of packaging.

Molding of the plastic around the leadframe also causes some leakage of the plastic onto the leadframe (flashing). The flash then has to be removed in a separate de-flashing (dejunking) step.

Attention is directed to commonly-owned U.S. Pat. No. 5,051,813, entitled PLASTIC-PACKAGED SEMICONDUCTOR DEVICE HAVING LEAD SUPPORT AND ALIGNMENT STRUCTURE, which discloses plastic packaging with and without dambars, dejunking, etc.

In the main, hereinafter, molding where the mold gate is disposed at the parting plane of the two mold halves is discussed, as most pertinent to the present invention.

The following U.S. Patents are cited of general interest in the field of packaging (annotations in parentheses): U.S. Pat No. 3,405,441 (hermetic sealing process using glass and metal lid on a ceramic substrate); U.S. Pat. No. 3,909,838 (package formed by sealing two halves or pre-molded body around a molded pill package bonded to a leadframe); U.S. Pat. No. 4,143,456 (glob top sealing devices mounted on a substrate); U.S. Pat. No. 4,264,917 (silicon substrate with glob top encapsulation); U.S. Pat. No. 4,300,153 (TAB device with a substrate bonded to the bottom of the die; glob top encapsulation); U.S. Pat. No. 4,330,790 (tape-mounted device encapsulated using a metal carrier and epoxy); U.S. Pat. No. 4,363,076 (flat TAB assembly); U.S. Pat. No. 4,507,675 (molded heatsink package); U.S. Pat. No. 4,594,770 (bonding a metal cap and a plastic cap around a leadframe); U.S. Pat. No. 4,857,483 (mold gate is not located at the parting plane of the mold halves); U.S. Pat. No. 4,872,825 (encapsulation method using a lamination process instead of injection or transfer molding); U.S. Pat. No. 4,874,722 (pre-molded flatpack encapsulated with silicone gel; dambar required; not encapsulated by molding); U.S. Pat. No. 4,890,152 (molded pin grid array package; not a surface mount flatpack construction); U.S. Pat. No. 4,913,930 (coating and encapsulating a device in a reel-to-reel format); U.S. Pat. No. 4,955,132 (flip chip mounting to a substrate); U.S. Pat. No. 4,961,105 (die back metallization); U.S. Pat. No. 4,974,057 (die coated with resin and then molded); U.S. Pat. No. 4,975,765 (high density flatpack with edge connectors; not a molded package); U.S. Pat. No. 4,982,265 (stackable TAB); U.S. Pat. No. 4,984,059 (leadframe tips overlap the top of the die surface); U.S. Pat. No. 4,996,587 (thin,stackable package); and U.S. Pat. No. 5,025,114 (leadframe construction resulting in multilayer structure for plastic packages).

The functional demands placed on modern integrated circuits have resulted in an ever-increasing demand for input/output (I/O) connections to the die. Hundreds of I/O connections are not uncommon. Commonly-owned, co-pending U.S. patent application Ser. No. 07/916,328 ("CNS-DIES"), discussed below, discloses a method for increasing I/O connections for an integrated circuit (die) of a given area. There remains a similar problem with the number of connections required in the package mounting and connecting to the die. Generally, there is a one-to-one correspondence between the number of package connections and the number of bond pads on the die.

Thus, there is a need for semiconductor packaging techniques that can accommodate increased lead count, particularly suited to the dies discussed in the aforementioned U.S. patent application Ser. No. 07/916,328.

Generally, semiconductor packages are used for (1) enclosing (protecting) a semiconductor (IC) die in some kind of package body, and (2) providing external connections for connecting the packaged die to external systems. Packaging the integrated circuit, requires at a minimum, (1) a conductive layer having a plurality of conductive lines, and (2) a "die-receiving area." As is discussed in greater detail hereinbelow, the inner ends of the conductive lines define the die-receiving area.

Once the die is mounted in (on) the die-receiving area, bond pads located on the die will be connected, usually by wire bonding or tape automated bonding (TAB) to inner end portions of the conductive lines.

Generally speaking, there are four distinct techniques of packaging a semiconductor device, in any case said package having one or more layers of conductive lines (leads, traces, or the like) exiting the package for electrically connecting the packaged die to other components, whether by mounting directly to a printed circuit (mother) board or by plugging the packaged device into a socket which in turn is mounted to the mother board. These are:

(1) plastic molding;
(2) ceramic packaging;
(3) PCB-substrate type packaging; and
(4) tape-based packaging.

Plastic molding typically involves a relatively rigid lead frame, wherein the lead frame has a patterned layer of conductive leads (conductive lines), the inner ends of which define the die-receiving area. A die is mounted to a die paddle, within the die-receiving area, and is connected to inner end portions of the conductive leads. The die and inner portion of the lead frame are encapsulated by plastic molding compound. Outer end portions of the conductive leads extend outside of the molded plastic body.

Ceramic packaging typically involves one or more layers of conductive traces (conductive lines) applied on interleaved ceramic layers. Again, the die-receiving area is defined by the inner ends of the conductive traces. Outer layers are typically ceramic. The die is mounted in a cavity (either up or down), connected to inner ends of the traces, and the cavity is closed by a lid. Outer ends of the traces are connected, within the ceramic, to external pins or leads (for example) on the exterior of the ceramic package body.

PCB-substrate type packaging involves a patterned layer of conductive traces (conductive lines) on a printed circuit board (PCB) substrate, and the inner ends of the conductive traces define the die-receiving area. The die is mounted to the substrate, connected to the inner ends of the traces, and may be encapsulated by epoxy, plastic molding compound, or in any suitable manner. Outer ends of the traces are connected to external pins or leads (for example), in a manner similar to ceramic packaging.

Tape-based packing involves a relatively non-rigid foil of conductive leads (conductive lines), supported by a plastic layer, and the inner ends of the conductive traces define the die-receiving area. A die is mounted to the substrate formed by the layer of conductive leads and plastic, and is connected to the inner ends of the conductive leads. Outer ends of the leads are connected to (or form) external interconnects for the packaged die.

In any of these, or other, packaging techniques, a die connected to conductive lines and having some sort of support and/or package body is referred to as a "semiconductor device assembly".

FIGS. 4A and 4B show two similar prior art layers 400, 400' of pattered conductive lines, which are applicable to any of the aforementioned package types. A "die-receiving area" 410, 410' is defined by the inner ends 408, 408' of a plurality of conductive lines 406, 406'. A die 402, 402' is mounted in the die-receiving area 410, 410' and bond pads 412, 412' on the die are connected to the inner ends of the conductive lines. Two techniques for attaching a die to conductive lines are shown. In FIG. 4A, the die 402 is wire bonded to the conductive lines 406, as indicated by bond wires 414 extending between the bond pads 412 and the conductive lines 406. In FIG. 4B, the die 402' is connected to the conductive lines 406' by tape automated bonding (TAB) techniques (indicated by 414'). Both of these techniques are well known. Other techniques (not shown) of connecting a die to a pattern of conductive lines include flip-chip and the like.

Notably, as shown in FIGS. 4A and 4B, the die is square. The conductive lines extend (radiate) from the die-receiving area, outward from the die. Hence, a subplurality of conductive lines are disposed on each of the four sides of the die, their inner ends defining a square die-receiving area. Also shown, by way of example, in FIGS. 4A and 4B are die attach pads 404, 404', which are generally somewhat larger than the die and somewhat smaller than the die-receiving area.

The conductive lines (406 and 406') include, but are not limited to, lead frame leads, tape leads, and traces on a ceramic or PCB substrate. Ultimately, a package body (not shown) may be formed about the die and inner portions of the conductive lines, as discussed above.

As a practical matter, the number of conductive lines (406 and 406') is determined by the number of bond pads (412 and 412') located on a given die (402 and 402'). A problem with the prior art is insufficient number of conductive lines (406 and 406').

Commonly owned, co-pending application Ser. No. 07/916,328 provides a technique for increasing the number of I/O bond pads for a given die. Hence, it is desirable to provide an increased number of conductive lines, defining a die-receiving area and connecting to the die bond pads, hence increasing the number of I/O connections.

Therefore, problems with mounting a die within a prior art square die-receiving area is the limitation placed on the number of conductive lines (406 and 406') defining the prior art square die-receiving area (e.g., 410 and 410'). Prior art inner ends (408 and 408') of conductive lines (406 and 406') make up a square die-receiving area, hence, providing I/O connection limited to the periphery of the square. Moreover, the prior art square die-receiving area does not accommodate the increased number of I/O connection on a given die provided in commonly owned co-pending patent application Ser. No. 07/916,328. Hence, what is needed is (at least) a layer of conductive lines defining a die-receiving area that provides an increased number of conductive lines, thus increasing the number of I/O connections.

RELATION TO CNS-DIES

This invention is similar, in concept, to commonly owned, copending U.S. patent application Ser. No. 07/916,328 ("CNS-DIES") in that there is a recognition that certain geometric shapes exhibit a greater ratio of periphery:area than squares. In the context of making I/O connections to an integrated circuit die, this geometric relationship can be used to great advantage.

As set forth in CNS-DIES, the demands placed on modern integrated circuits are headed in two directions:

1. Fitting (fabricating) as many active elements as possible in the active element area, to create more complex devices; and
2. Fitting as many bond pads as possible in an I/O area, typically around the perimeter of the die, to accommodate an increased number of I/O connections.

To satisfy these demands, CNS-DIES discloses what is generally termed "certain non-square" dies that provide an increase in the number of bond pads for a die of a given size (area). As disclosed in CNS-DIES, these "certain non-square" dies include, inter alia:

(1) equilateral triangular shaped dies providing 14% more I/O than a square die of the same size (area);
(2) right isosceles triangular shaped dies providing 21% more I/O than a square die of the same size (area);
(3) 30°-60°-90° right triangular shaped dies providing 28% more I/O than a square die of the same size (area);
(4) "Greatly Elongated Rectangular" shaped dies providing 16% more I/O than a square die of the same size (area); and
(5) Parallelogram shaped dies providing 14% more I/O than a square die of the same size (area).

The teachings of CNS-DIES provides for certain non-square dies that yield an increased number of bond pads in the I/O area, and hence, a more efficient utilization of the active element area. As illustrated therein, certain non-square dies will provide an increased number of bond pads in the I/O area, hence, allowing for an increase in connections to conductive lines of the lead frame (e.g.), hence, increasing the number of I/O connections available for a semiconductor package. However, the prior art technique of packaging semiconductor dies provides for a square (or not greatly elongated rectangular) die-receiving area. A square die-receiving area will not have sufficient conductive lines to accommodate the increased number of bond pads in certain non-square dies. Furthermore, as will be shown hereinbelow, geometric configurations of a prior art square die-receiving area provides for fewer conductive lines than certain non-square die-receiving areas of the present invention.

Prior art semiconductor packaging techniques do not provide for mounting certain non-square dies. For example, the prior art would not permit certain non-square dies to be mounted conveniently in the prior art square die-receiving area. For one thing, many of the bond wires (e.g.) would be excessively long, since there is not a good fit between triangles (e.g.) and squares (e.g.). The industry is in need of a semiconductor package having a die-receiving area that provides an increased number of conductive lines, and that will accommodate the packaging of the certain non-square dies disclosed in CNS-DIES and satisfying the demands for increased I/O connections.

Parent U.S. patent application Ser. No. 07/933,430, which itself is a continuation-in-part of the aforementioned 07/916,328 (CNS-DIES), discloses various techniques for packaging certain non-square dies.

Parent U.S. patent application Ser. No. 07/834,182 discloses a novel packaging technique which is not explicitly directed to packaging certain non-square dies (although such is not specifically excluded from that case).

DISCLOSURE OF THE INVENTION

It is therefore an object of the present invention to provide an improved technique for packaging a die.

It is another object of the present invention to provide a packaging technique that is relatively inexpensive and relatively easy to manufacture, and reliable.

It is another object of the present invention to provide a packaging technique that does not rely on expensive tooling for trimming dambars, that does not rely on additional tooling for dejunking, and the like.

It is another object of the present invention to provide a plastic packaging technique that minimizes wire sweep, and allows for tighter lead-to-lead spacing and increased pin count.

It is another object of the present invention to provide a layer of conductive lines having an increased number of conductive lines for given die-receiving area.

It is another object of the present invention to provide "certain non-square" die-receiving areas corresponding to "certain non-square" dies, especially in a package of the type disclosed in parent U.S. patent application Ser. No. 07/834,182.

It is another object of the present invention to provide a semiconductor package having a certain non-square die-receiving area corresponding to a certain non-square die.

It is another object of the present invention to provide a semiconductor package having increased conductive lines for increased I/O connections.

It is another object of the present invention to provide semiconductor packages that layout more efficiently on a given printed circuit (mother) board.

According to the invention, a dambar-less leadframe is sandwiched between two printed circuit boards (PCBs). The PCBs form a major portion of the package body, and isolate the leadframe leads from plastic molding compound.

In one embodiment of the invention, an upper PCB (substrate) is formed as a square ring, having an opening containing a heat sink element. A lower PCB is also formed as a square ring, and has a smaller opening for receiving a die. The back face of the die is mounted to the heat sink. The exposed front face of the die is wire bonded to inner ends of traces on the exposed face of the lower PCB. The outer ends of the traces are electrically connected to the leadframe leads by plated-through vias extending through the two PCBs. The plated-through vias additionally secure the sandwich structure together. Plastic is injection/transfer molded over the front face of the die and the bond wires, forming a partially-molded package.

In another embodiment of the invention, the upper PCB is a solid planar element, and is not provided with an opening for a heat sink. The back face of the die is mounted to the inside surface of the upper PCB.

Further, according to the invention, the conductive lines (leads) of the leadframe are patterned to define a certain non-square die-receiving area for mounting a certain non-square die.

According to an aspect of the present invention, the conductive lines define a triangular die-receiving area for mounting triangular dies.

According to another aspect of the present invention, conductive lines define a parallelogram shaped die-receiving area for mounting parallelogram shaped dies.

According to another aspect of the present invention, conductive lines define a greatly elongated rectangular shaped die-receiving area for mounting greatly elongated rectangular shaped dies.

According to another aspect of the present invention, conductive lines define a trapezoidal shaped die-receiving area for mounting greatly elongated rectangular shaped dies.

According to another aspect of the present invention, any of the geometric shapes formed by the inner ends of the conductive lines are applicable to lead frame leads, conductive traces, and the like, in various forms of semiconductor packaging.

Generally, the outside shape of a package body (i.e., the printed circuit board substrates or the plastic encapsulant) containing the die may be square, rectangular (not greatly elongated) or any other "traditional" shape.

According to another aspect of the present invention, a package body is formed, and the external shape of the package is similar to the shape of the die-receiving area formed by the inner ends of the conductive lines. Inasmuch as the die-receiving areas are termed "certain non-square" these packages are also "certain non-square".

According to another aspect of the present invention, a number of "certain non-square" packages are laid out more efficiently on a printed circuit (mother) board.

Other objects, features and advantages of the invention will become apparent in light of the following description thereof.

BRIEF DESCRIPTION OF THE DRAWINGS

FIG. 1 is a section taken on lines 1—1 of FIG. 2.

FIG. 9 is a cross-sectional view of a plastic molded semiconductor package enclosing a die mounted to a die attach pad (paddle) within a corresponding die-receiving area defined by inner end leads according to the present invention.

FIG. 10 is a cross-sectional view of a tape-based, by way of example plastic molded, semiconductor package enclosing a die mounted on a tape substrate within a corresponding die-receiving area defined by inner end leads according to the present invention.

DETAILED DESCRIPTION OF THE INVENTION

Figure 1:
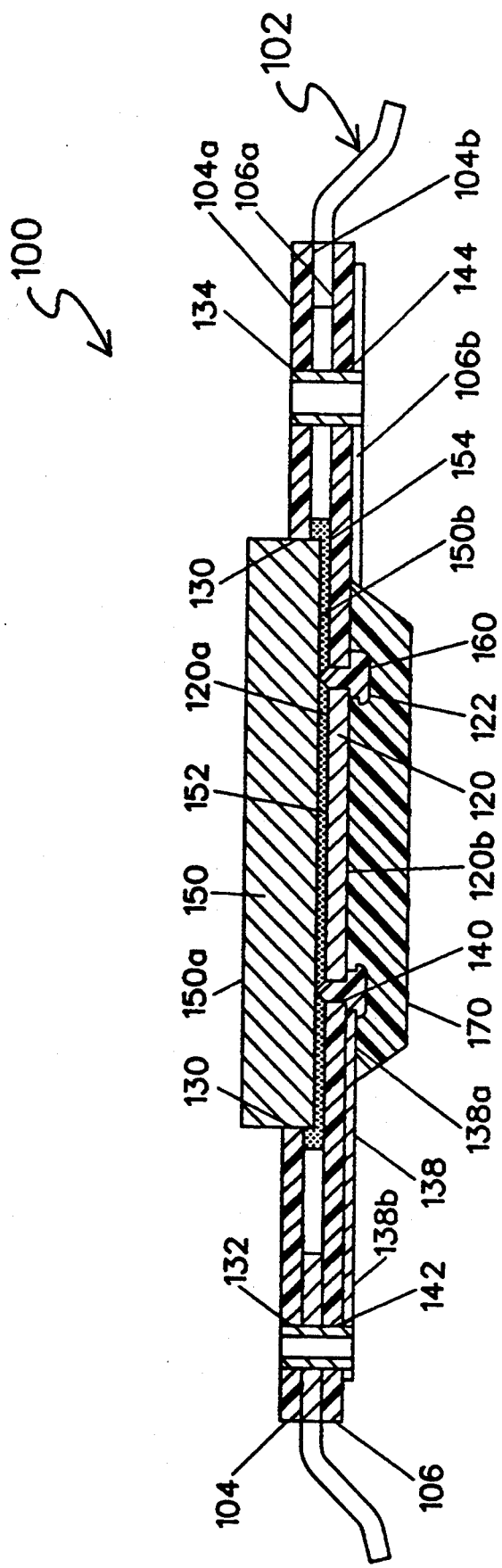
FIG. 1 is a cross-sectional view of a first embodiment of the partially-molded PCB chip carrier of the present invention.
Figure 2:
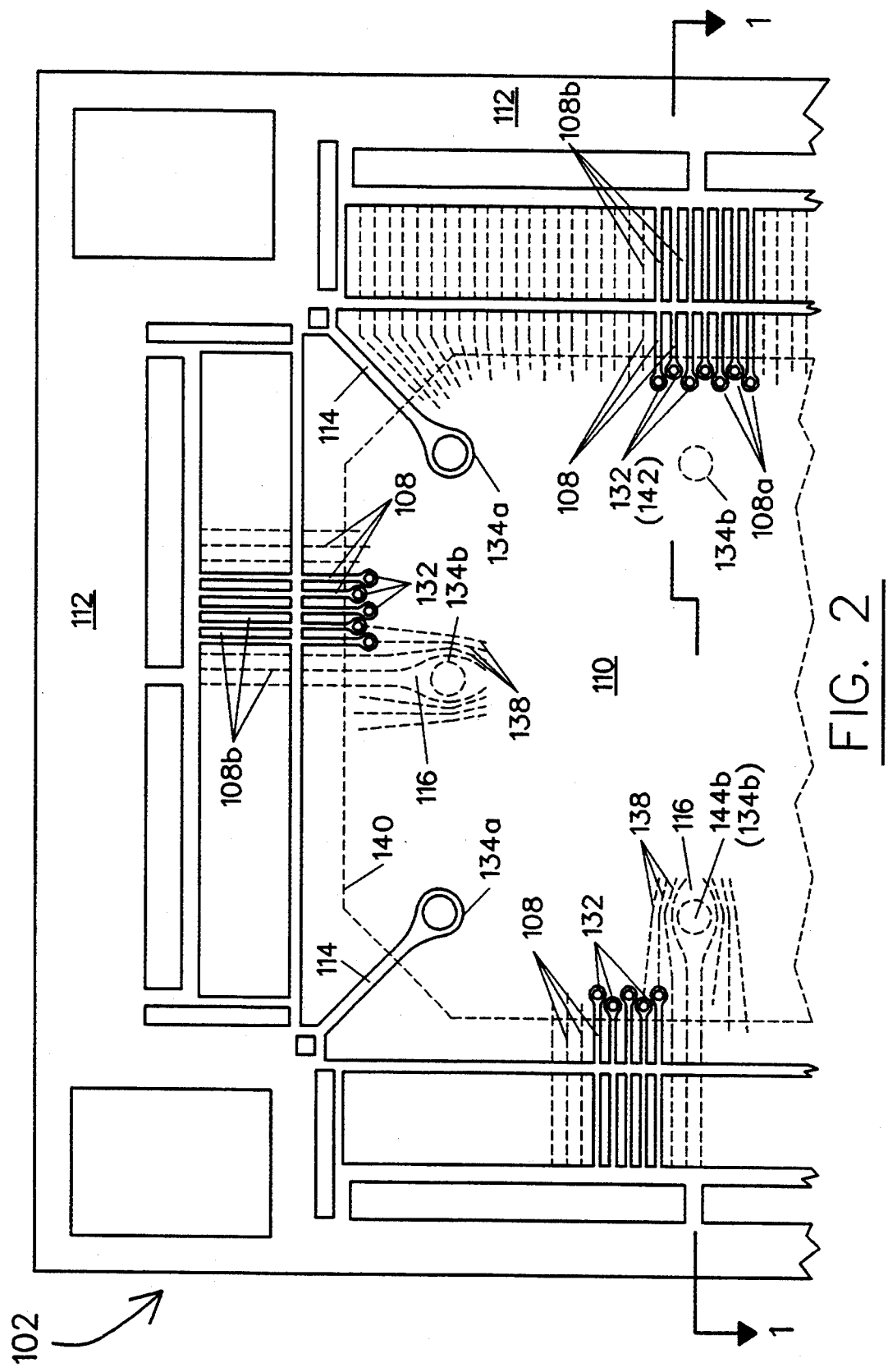
FIG. 2 is a plan view of the leadframe element of the chip carrier of FIG. 1, at an earlier stage of fabrication.

FIGS. 1 and 2 show a molded PCB chip carrier package 100, according to the present invention.

With particular reference to FIG. 1, the completed package 100 is essentially a sandwiched construction, wherein a leadframe 102 (shown in FIG. 2) is disposed between two printed circuit boards (PCBs)—an upper PCB (or substrate) 104 and a lower PCB (or substrate) 106. The PCBs 104 and 106 constitute a major portion of what is ultimately to become the package "body".

The upper PCB 104 has an upper, exterior surface 104a and a lower, interior surface 104b. Similarly, the lower PCB 106 has an upper, interior surface 106a and a lower, exterior surface 106b.

With particular reference to FIG. 2, the leadframe 102 is a fairly standard affair, in that it includes a plurality of closely-spaced, fine gauge leads 108 extending from a square central area 110 to an outer support ring 112. A semiconductor die 120 (See FIG. 1) is ultimately electrically connected to inner ends 108a of the leads 108. Whereas in the prior art, the die is usually connected with bond wires directly to the inner ends of the leads 108, according to the present invention the die is connected indirectly through the intermediary of the PCB 106 to the leads 108, as discussed in greater detail hereinafter.

The die 120 has an upper (as viewed in FIG. 1) surface 120a which is the "back" side (face) of the die, and has a lower (again, as viewed) surface 120b which is the "front" side of the die and contains circuit elements (not shown) and bond pads 122.

The upper PCB 104 is formed generally as a ring, having a central opening 130 extending fully through the board. The opening is preferably substantially larger, such as 0.200 inch larger, than the size of the die 120.

A number "n" of through holes 132 are disposed about the periphery of the upper PCB 104. The number "n" corresponds to the number of leads 108 in the leadframe, and each through hole 132 is disposed to align with a particular lead 108 of the leadframe.

The through holes 132 are, if necessary, disposed in two or more offset rows about the periphery of the upper PCB to accommodate the close spacing of the leads. (Two offset rows of holes 132 are shown in FIG. 2.) For example, with 0.008 inch leads spaced apart on the order of 0.020 inches, and through holes 132 having a diameter on the order of 0.020 inches, it would simply be impossible to accommodate one through hole per lead with just a single row of through holes 132 extending around the periphery of the upper PCB 104 (shown in phantom in FIG. 2).

Optionally, as shown, the upper PCB 104 is also provided with a few additional through holes 134, disposed inwardly (nearer the opening 130) of the through holes 132. These through holes 134 are preferably disposed evenly about the upper PCB, taking care to avoid alignment with leads 108. Rather, they may be aligned with (corner) tiebars 114 of the leadframe, such as is the case with the four corner-aligned through holes 134a. Or, the leadframe can be modified so that there is a suitable lead-free "void" 116 aligned with the four side edge through holes 134b.

The upper PCB 104 is shown devoid of wiring patterns (conductors; traces). However, it could be provided with a metal power or ground plane foil, preferably on its upper surface 104a, which could be segmented.

The lower PCB 106 is also formed generally as a ring, of shape similar to that of the upper PCB 104, and having a central opening 140 extending fully through the board. The opening is larger, such as 0.025 inch larger, than the size of the die 120.

A number "n" of through holes 142 are disposed about the periphery of the lower PCB 106. The through holes 142 in the lower PCB 106 are aligned with the through holes 132 in the upper PCB 104. Again, the number "n" corresponds to the number of leads 108 in the leadframe, and each through hole 142 is disposed to align with a particular lead 108 of the leadframe. Again, the through holes 142 are, if necessary, disposed in two or more offset rows about the periphery of the lower PCB 106 to accommodate high density leads 108.

Optionally, as shown, the lower PCB 106 is also provided with a few additional through holes 144, as was the upper PCB (i.e., through holes 134), disposed inwardly of the through holes 142. These through holes 144 are preferably disposed evenly about the lower PCB, taking care to avoid alignment with leads 108. Rather, they are aligned with tiebars 114 of the leadframe, such as is the case with the four corner through holes 144a. Or, as mentioned above (with respect to the through holes 134) the leadframe can be modified so that there is a suitable lead-free "void" 116 aligned with the four side edge through holes 144b.

Whereas the upper PCB 104 did not have conductive lines, the lower PCB is provided with a wiring layer of conductors (traces) 138. These conductors 138 each extend from a respective through hole 142 towards the inner periphery of the lower PCB, preferably to within 0.010 inches of the opening 140 so as to be adjacent the die 120. The conductors 138 are electrically connected to the through holes 142. A preferred method of making this connection is simply plating the through holes 142 (and 132). In essence, the through holes 132 and 142 are simply formed as plated through vias, a well known technique. Inner ends 138a of the conductors 138 are left exposed, for connecting to the die 120. The remaining, outward portions 138b of the conductors 138 are preferably coated with solder mask material, for purposes of electrical insulation.

As shown in FIG. 2, the conductors 138 are laid out (routed) to form a void 116 for the optional through holes 134b and 144b.

In the embodiment shown in FIGS. 1 and 2, the upper PCB 104 is a square ring with a central opening 130 larger than the opening 140 in the lower PCB 106.

By way of example, the upper PCB 104, the lower PCB 106 and the die-receiving area formed by inner ends of the leads are all suited to accept square dies.

According to the invention, as will be more evident hereinbelow, the upper PCB 104, the lower PCB 106 and the die-receiving area formed by inner ends of the leads are all suited to accept "certain non-square" dies, such as those disclosed in the aforementioned U.S. patent application Ser. No. 07/916,328.

A heat sink 150 is disposed in the opening 130, and since the opening 140 in the lower PCB 106 is smaller than the heat sink, the upper surface 106a of the lower PCB 106 acts as a "stop" against further insertion of the heat sink. The heat sink has an upper surface 150a and a lower surface 150b, and is suitably simply a flat plate-like member, although it could be provided with fins or other heat-spreaders on its exposed surface 150a, and is preferably formed of copper, or other suitable thermally conductive sink material.

The die 120 is disposed within the hole 140 in the lower PCB 106, and comes to rest against the lower surface 150b of the heat sink 150. An adhesive 152 is preferably used to secure the back side (upper surface) 120a of the die 120 to the inner face (bottom surface) 150b of the heat sink. The adhesive is preferably thermally conductive, and the intimate juxtaposition of the die to the heat sink allows for effective thermal dissipation. A suitable adhesive is Ablebond 84-1LMIS, available from Ablestick Laboratories.

As mentioned hereinabove, the package 100 is a sandwich-like construction. To assemble the package, the leadframe 102 is interposed between the upper and lower PCBs, and the holes through 132 and 142, and optionally 134 and 144, are plated, forming (if you will) "rivets" extending through the through holes, from one PCB to the other PCB, and electrically connecting the through holes 132 and 142 to respective leadframe conductors 108.

The next stage of assembly would be inserting the heat sink 150 into the opening 130, and the heat sink may be secured by a suitable adhesive 154 adhering the bottom surface 150b of the heat sink 150 to the upper surface 106a of the lower PCB. Advantageously, the periphery of the heat sink is also sealed (and incidentally adhered) to the inner edge of the opening 130 in the upper PCB 104 by the adhesive 154.

Next, the die is mounted to the heat sink, as discussed hereinabove, and is connected to the lead frame conductors with bond wires 160.

Finally, plastic 170 is molded about the front face (bottom surface) 120b of the die, including over the bond wires 160, and completely covering the opening 140 in the lower PCB 106. Preferably, the plastic 170 extends sufficiently along the lower surface 106b of the lower PCB 106 to cover the exposed ends 138a of the conductors 138. The molding of the plastic 170 is suitably performed in a transfer molding process, wherein the entire package is mounted between two mold halves, and liquid molding compound is introduced, via a mold gate at the parting plane of the mold halves, into a mold cavity. The plastic 170 forms a package "body". The PCBs 104 and 106 form a package "substrate".

Hence, it is seen that molding of plastic is done around the chip only, and a central portion of the PCB 106. The molding compound (plastic) does not contact the leadframe, so there is no need for a dambar, there is no need for removing a dambar, and there is no need for dejunking excess plastic from the leads 108 or from between leadframe leads. By avoiding a dambar, trimming and dejunking, cost is reduced and closer lead spacing can be achieved.

The package is targeted as a replacement for fully-molded plastic packages, especially those having high pin counts, although its utility is not limited thereto. By molding only a small portion of the package body, the amount of plastic molding compound required is reduced, allowing a high degree of flexibility in mold gate design and diminishing wire wash problems.

The package is not restricted in size by molding technology. This, together with the ability to space the leads closer together allows for much higher pin count packages than is otherwise possible with standard (fully) molded packages.

As noted above, fins or other heat-spreaders can readily be added to the heatsink, and the PCB 106 can be made of multilayer construction to allow for more complex electrical connections, such as crossover traces and mounting external components to the PCB.

ALTERNATE EMBODIMENT

Figure 3:
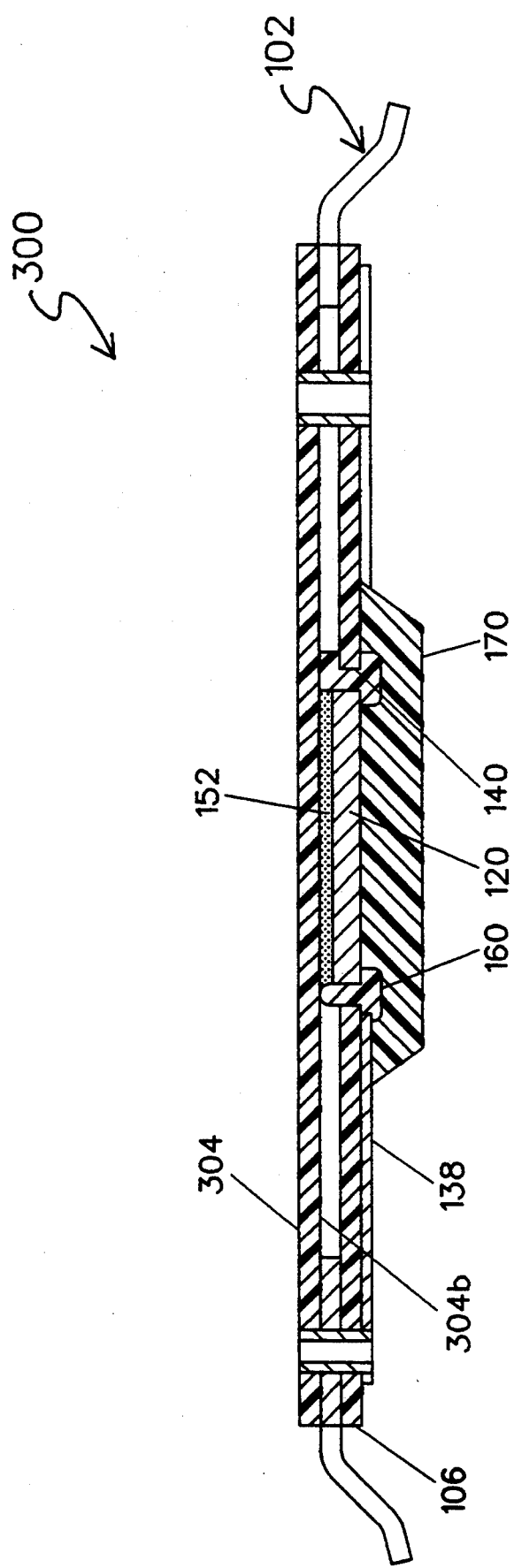
FIG. 3 is a cross-sectional view of another embodiment of the partially-molded PCB carrier of the present invention.

FIG. 3 shows an alternate embodiment 300 of the partially-molded PCB package of the present invention. In this embodiment, the upper PCB (or substrate) 304 is formed as a simple planar element, without a central opening 130. Evidently, there is also no heat sink 150.

As shown in FIG. 3, the die 120 is mounted directly to the underside 304b of the upper PCB 304.

Also, in the embodiment of FIG. 3, the leadframe leads 108 can be longer than in the FIG. 1 embodiment, and can extend more fully towards the opening 140 in the lower PCB 106.

Generally, this embodiment provides the same advantages and -benefits as the previous embodiment. Of course, this embodiment lacks the integral heatsink element 150.

It should be understood that the package, sans die and molding compound, forms a useful product in the semiconductor industry, wherein a manufacturer would separately produce or have produced the sandwiched assembly of PCBs and leadframe, and subsequently mount and electrically connect the die within the package, and encapsulate the die with the plastic molding compound. The following terms are used in the description that follows:

Die—A semiconductor integrated circuit (It).

Package—Any means of supporting, enclosing, and connecting a die to an external system.

Conductive Line—Any of a number of means, such as conductive leads and conductive traces, for connecting to a semiconductor die.

Die-receiving Area—The area defined by the inner ends of the conductive lines whereby a semiconductor die is mounted.

Inner Lead Count—The number of inner ends of conductive lines defining the die-receiving area.

Certain non-square configurations—Includes triangular (e.g., equilateral triangle, right isosceles triangle, and 30°-60°-90° triangle), "greatly elongated rectangular" shaped, parallelogram shaped, and trapezoidal shaped. See also commonly owned, copending application Ser. No. 916,328.

Greatly Elongated Rectangular—Includes rectangular shapes having a base:height (length:width) ratio of at least 3:1, for example 3.5:1, 4:1, 4.5:1 and 5:1.

Figure 4A:
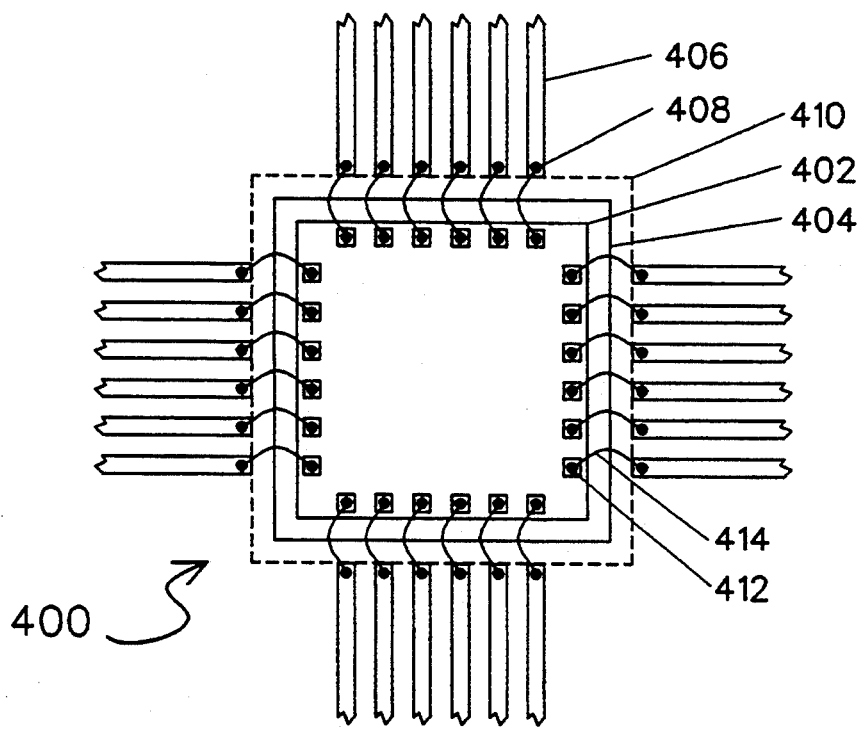
FIG. 4A is a plan view diagrammatic representation of a prior art patterned layer of conductive lines, employing a wire bond technique for connecting a die to the conductive lines.
Figure 4B:
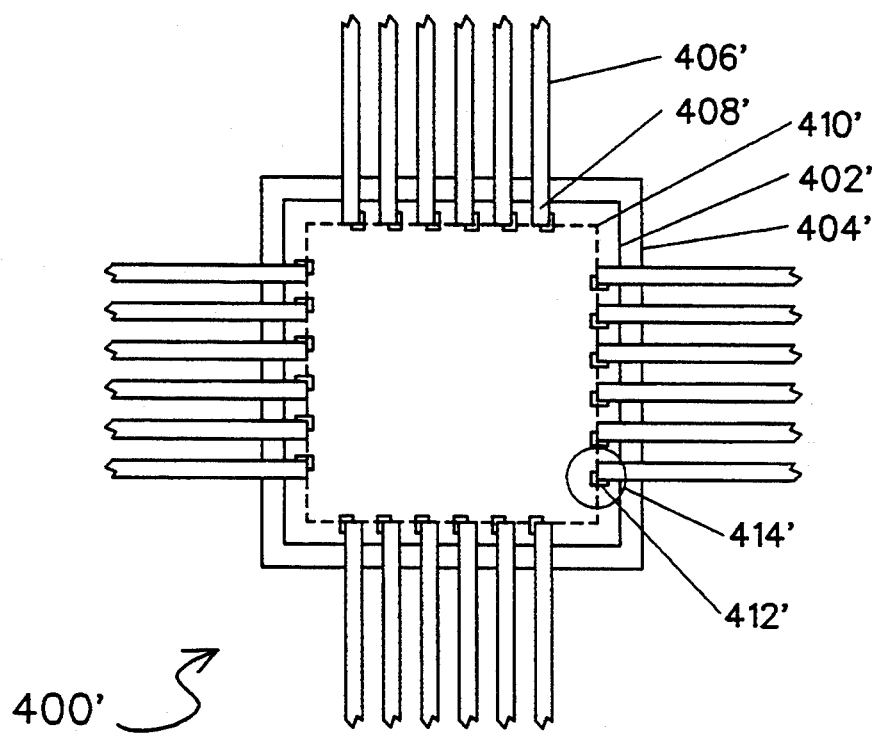
FIG. 4B is a plan view diagrammatic representation of a prior art patterned layer of conductive lines, employing a Tape Automate Bonding technique for connecting a die to the conductive lines.

FIGS. 4A and 4B show prior art (square) die-receiving areas defined by inner ends of conductive lines employing wire bonding and tape automated bonding techniques, respectively, for package types other than that of parent U.S. patent application Ser. No. 07/834,182, and have been discussed hereinabove. By way of review, the conductive lines may be leads on a lead frame in plastic molded semiconductor packages, leads on a tape substrate, traces on a conductive layer of a ceramic semiconductor package, and traces on a conductive layer on a printed circuit board (PCB) substrate. The prior art square (and non-greatly elongated) die-receiving areas provide an unfavorable ratio of inner lead count ($n_{lead}$) to die-receiving area ($A_{die}$).

As will be shown hereinbelow, patterned layers of conductive lines defining "certain non-square" die-receiving areas yield an increase in the ratio of inner conductive lines to die-receiving area (e.g., greater ratio of $n_{lead}$:$A_{die}$).

The number of conductive lines that can be accommodated about the periphery of a die-receiving area is closely related to the perimeter of the die-receiving area. (Throughout this discussion it is assumed that the spacing and pitch of the conductive lines is fixed.) Therefore, according to the present invention, if it is desired to increase the lead count for a given size of die-receiving area (hence, for a die of given area), the perimeter of the die-receiving area must be increased while maintaining the area of the die-receiving area constant. As will be discussed in greater detail hereinbelow, comparisons of prior art square die-receiving areas to certain non-square die-receiving areas will show that certain non-square die-receiving areas provide for increased lead count for a given area (e.g, increased $n_{lead}$:$A_{die}$).

According to the present invention, certain non-square die-receiving areas having more favorable ratios of perimeter:area ("P:A"), allowing for increased number of inner end conductive lines in the periphery of the die-receiving area. In other words, P:A is closely related to $n_{lead}$:$A_{die}$.

By way of theoretical application to illustrate the present invention, consider the case of a prior art square die-receiving area (FIG. 4A—410, and FIG. 4B—410'), having an area of one unit$^2$. For a prior art square die-receiving area having four sides, each measuring one unit, the perimeter is four units and the area one unit$^2$. The ratio of the perimeter to area, P:A, for the prior art square die-receiving area is 4:1. According to the present invention, as shown hereinbelow, the ratio of the perimeter to area for certain non-square die-receiving area is greater than 4:1, allowing for an increase in I/O connections (lead count).

CERTAIN NON-SQUARE DIE-RECEIVING AREAS

Figure 5A:
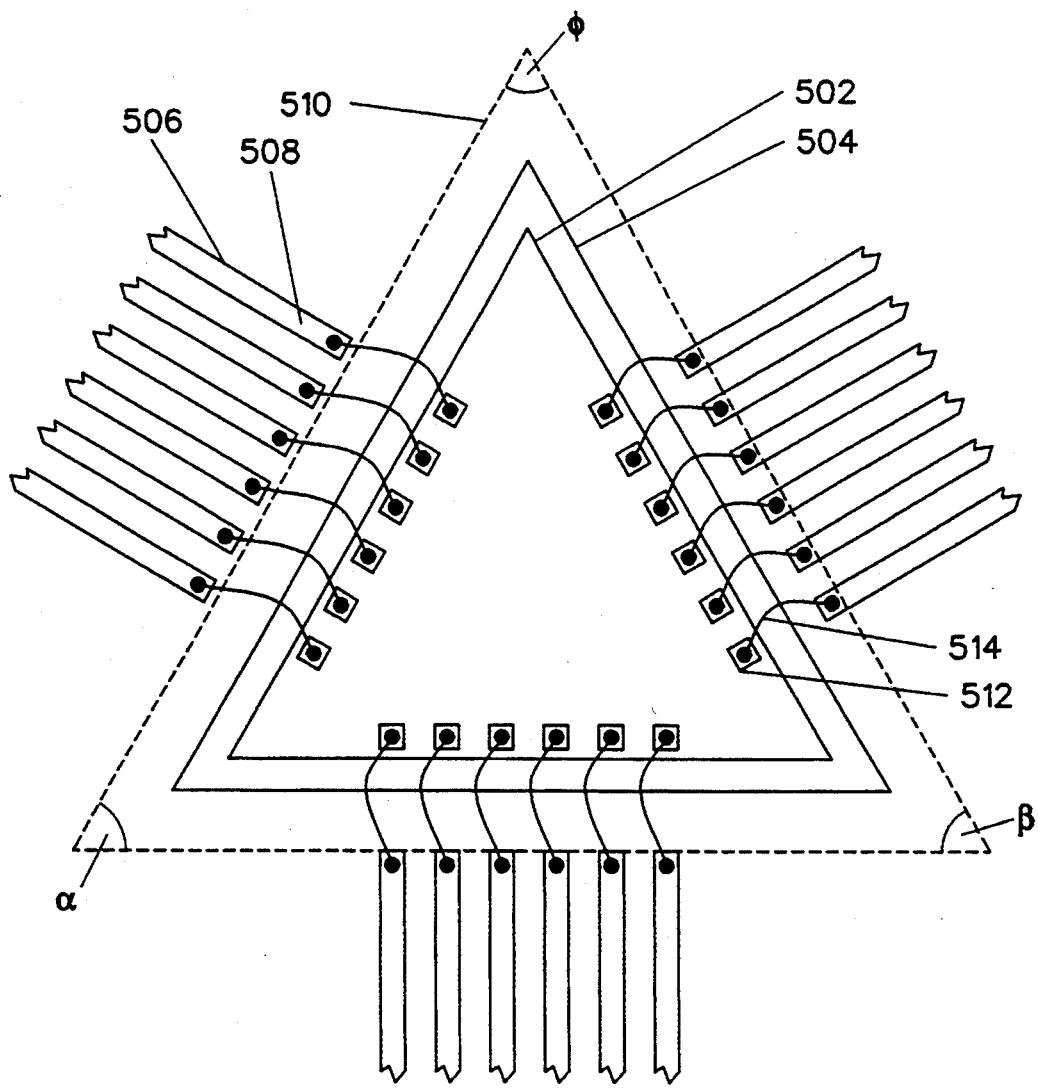
FIG. 5A is a plan view diagrammatic representation of a patterned layer of conductive lines, the inner ends of the conductive lines forming a triangular die-receiving area, according to the present invention, and employing a wire bond technique for connecting a die to the conductive lines.
Figure 5B:
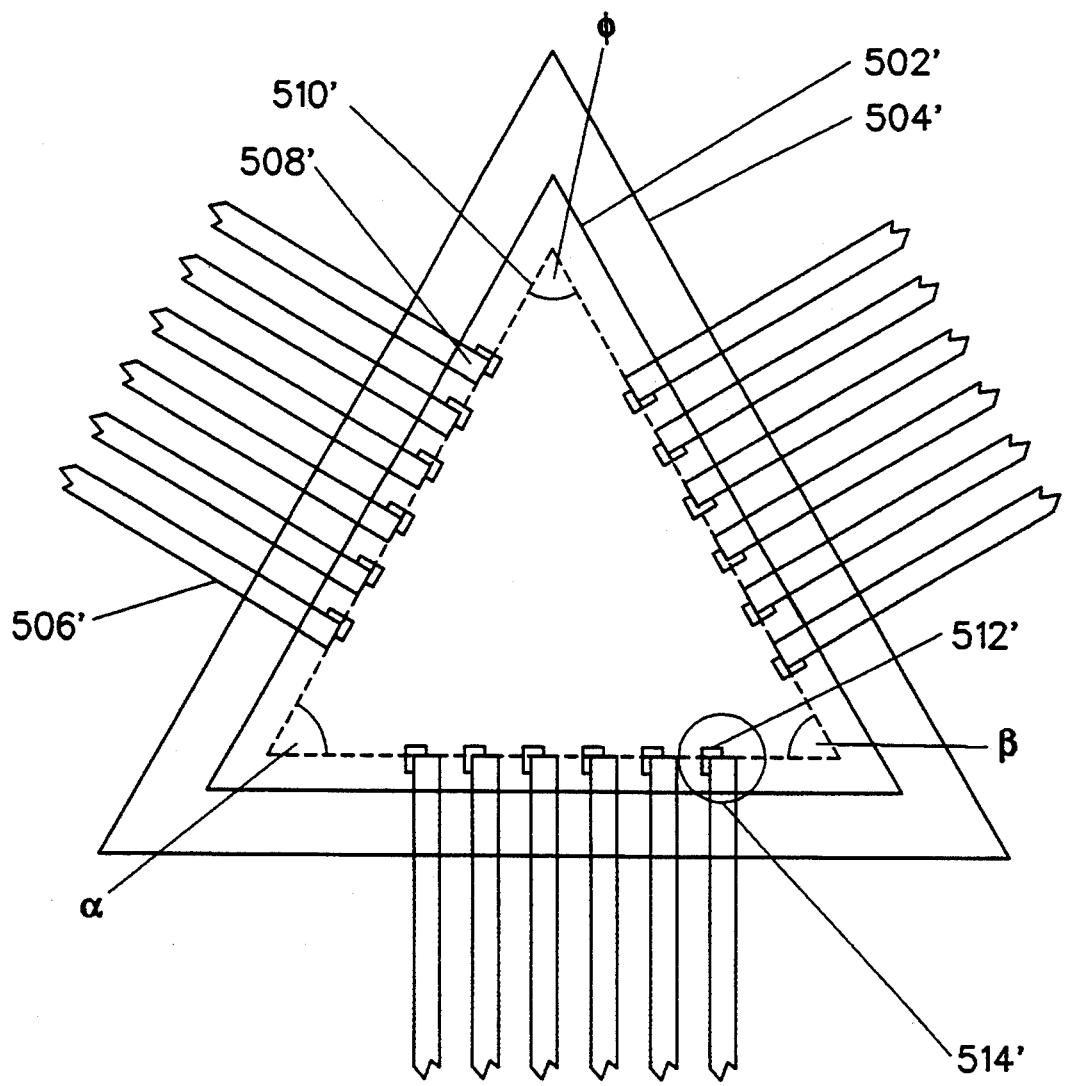
FIG. 5B is a plan view diagrammatic representation of a patterned layer of conductive lines, the inner ends of the conductive lines forming a triangular die-receiving area, according to the present invention, and employing a Tape Automate Bonding technique for connecting a die to the conductive lines.

FIGS. 5A and 5B illustrate one embodiment 500, 500' of the present invention. A triangular die-receiving area 510, 510' is defined by inner ends 508, 508' of conductive lines 506, 506' radiating from the three sides of the die-receiving area. A die 502,502' is mounted within the die receiving area 510, 510'. Bond pads 512, 512' on the die 502, 502' are connected to the inner ends 508, 508' of the conductive lines 506, 506'. In FIG. 5A, bond wires 514 connect the bond pads 512 to the inner ends 508 of the conductive lines 506. In FIG. 5B, the inner ends 508' of the conductive lines 506' are tape automated bonded (TABbed), indicated by 514', to the bond pads 512' on the die 502'. Other techniques (not shown) of connecting a die to a pattern of conductive lines, such as flip-chip are known. The particular method of connecting the die to the pattern of conductive lines, or conductive pads (not shown) should not be construed as limiting the scope of the present invention.

It should be understood that the conductive lines (506 and 506') include, but are not limited to, lead frame leads (plastic packaging), leads in tape-based packaging, patterned traces in conductive layers (ceramic packaging), or patterned traces in a PCB-type substrate. This will be shown, hereinbelow. The die and inner end portions of the conductive lines are usually enclosed within a package body (not shown). Various package body types are discussed hereinbelow.

It should be understood that a relatively small number of conductive lines (506 and 506') are shown, for illustrative clarity, and that there may up to a hundred, or more, conductive lines on each side of the die.

FIGS. 5A and 5B also illustrate a triangular die attach pad (504 and 504'). The die attach pad is necessary for mounting the die, in some packaging techniques. In cases where the die attach pad is used, the shape of the die attach pad will conform with (be similar to) the shape of the die-receiving area, which preferably conforms to the shape of the die mounted in the die-receiving area.

FIGS. 5A and 5B show a generalized triangular die-receiving area having three angles: alpha ($\alpha$). beta ($\beta$) and phi ($\Phi$). In the case of these three angles defining an equilateral triangular shape for the die-receiving area (i.e., $\alpha = 60°$, $\beta = 60°$, $\Phi = 60°$), the ratio of Perimeter:Area (P:A) for a die-receiving area having an area of one unit$^2$ is P:A=4.56:1, or 14% more perimeter than the (same unit$^2$ area) square die-receiving area discussed above.

In the case of these three angles defining a right isosceles triangular shape for the die-receiving area (i.e., $\alpha = 45°$, $\beta = 45°$, $\Phi = 90°$), the ratio of Perimeter:Area (P:A) for a die-receiving area having an area of one unit$^2$ is P:A=4.828:1, or 20% more perimeter than the (same unit$^2$ area) square die-receiving area discussed above.

In the case of these three angles defining another right triangular shape for the die-receiving area (i.e., $\alpha = 30°$, $\beta = 60°$, $\Phi = 90°$), the ratio of Perimeter:Area (P:A) for a die-receiving area having an area of one unit$^2$ is P:A=5.085:1, or 27% more perimeter than the (same unit$^2$ area) square die-receiving area discussed above.

Therefore, a triangular die-receiving area 510, 510' will exhibit an increased ratio of perimeter to area (P:A), vis-a-vis a square die-receiving area. Hence, for conductive lines of given dimension, pitch and spacing, more conductive lines (and I/O connections) can be accommodated around the same size (die-receiving) area.

It will be evident that a similar increase in P:A can be obtained with other (than triangular) "certain non-square" die receiving areas, according to the present invention. Calculations for each are not necessary. Similar calculations, relating to the ratio of periphery:area for a die, can be found in the parent case.

Figure 6:
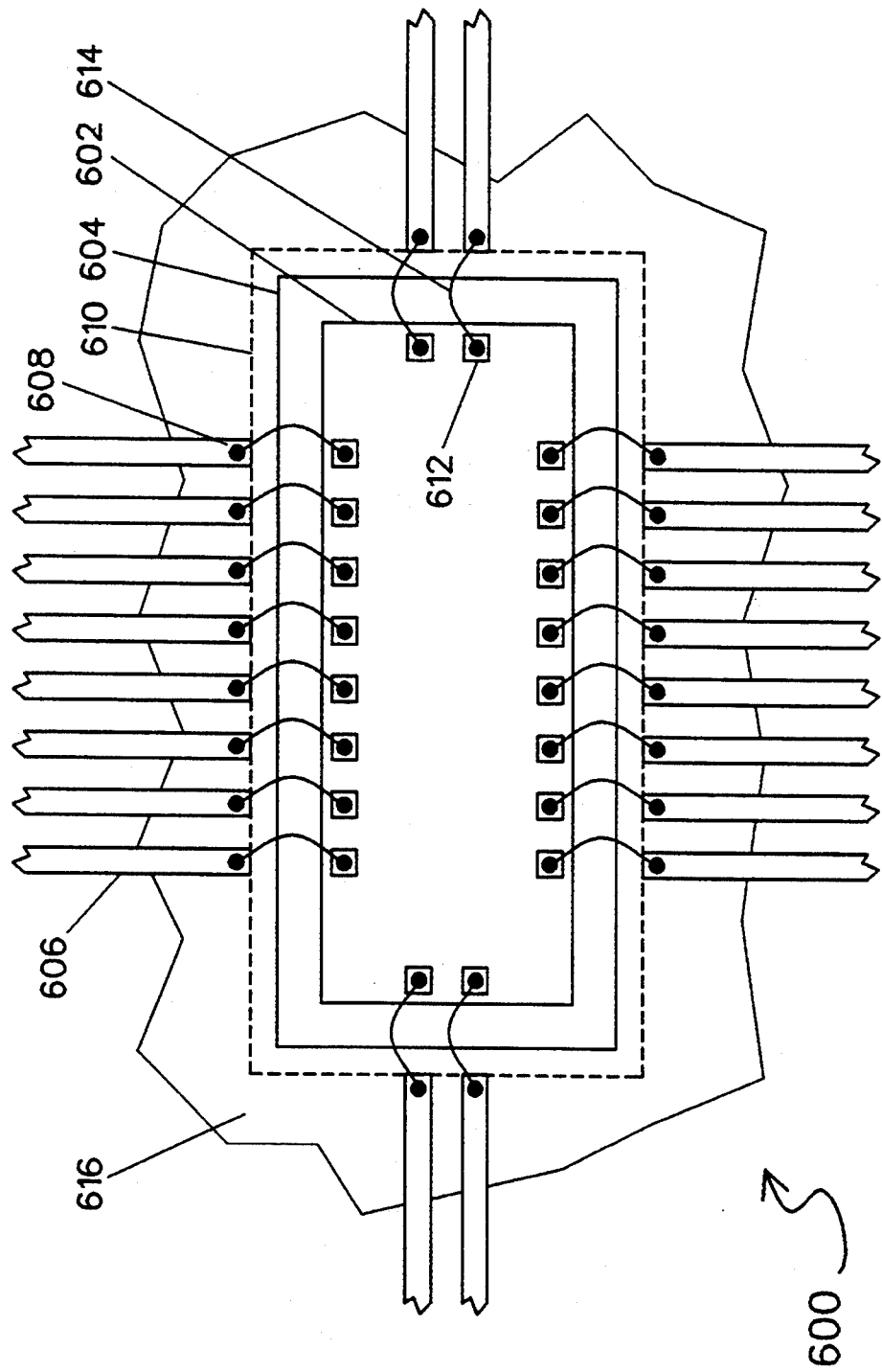
FIG. 6 is a plan view diagrammatic representation of a patterned layer of conductive lines, the inner ends of the conductive lines forming a "greatly elongated rectangular" shaped die-receiving area, according to the present invention, and employing a wire bonding technique (by way of example) for connecting a die to the conductive lines.

FIG. 6 shows an alternate embodiment 600 of the present invention, wherein the "certain non-square" die-receiving area is "greatly elongated rectangle" shaped. In this, and in subsequent examples, only wire bonding is shown. It should be understood throughout the descriptions of the present invention that any suitable technique can be used to connect a die to conductive lines, including wire bonding, TAB, flip-chipping, etc.

The greatly elongated rectangular die-receiving area 610 is defined by the inner ends 608 of conductive lines 606 radiating from the four sides of the die-receiving area. A die 602 is mounted within the die-receiving area 610 and bond pads 612 are connected to the conductive lines 306 by bond wires 614.

The conductive lines 606 include, but are not limited to, lead frame leads (plastic packaging), leads on tape substrates, patterned traces on conductive layers (ceramic packaging), or patterned traces on PCB substrates. As mentioned hereinbefore, there may be a greater number of conductive lines than are shown, the die can be mounted on a die attach pad 604 (preferably conforming to the shape of the die and of the die-receiving area), and the die can be enclosed in a package body (not shown).

The perimeter to area ratio (P:A) for a greatly elongated rectangular die-receiving area of unit$^2$ area will be 4.62:1, which will accommodate 15% more conductive lines than a similar size prior art (e.g., square) die-receiving area.

Figure 7:
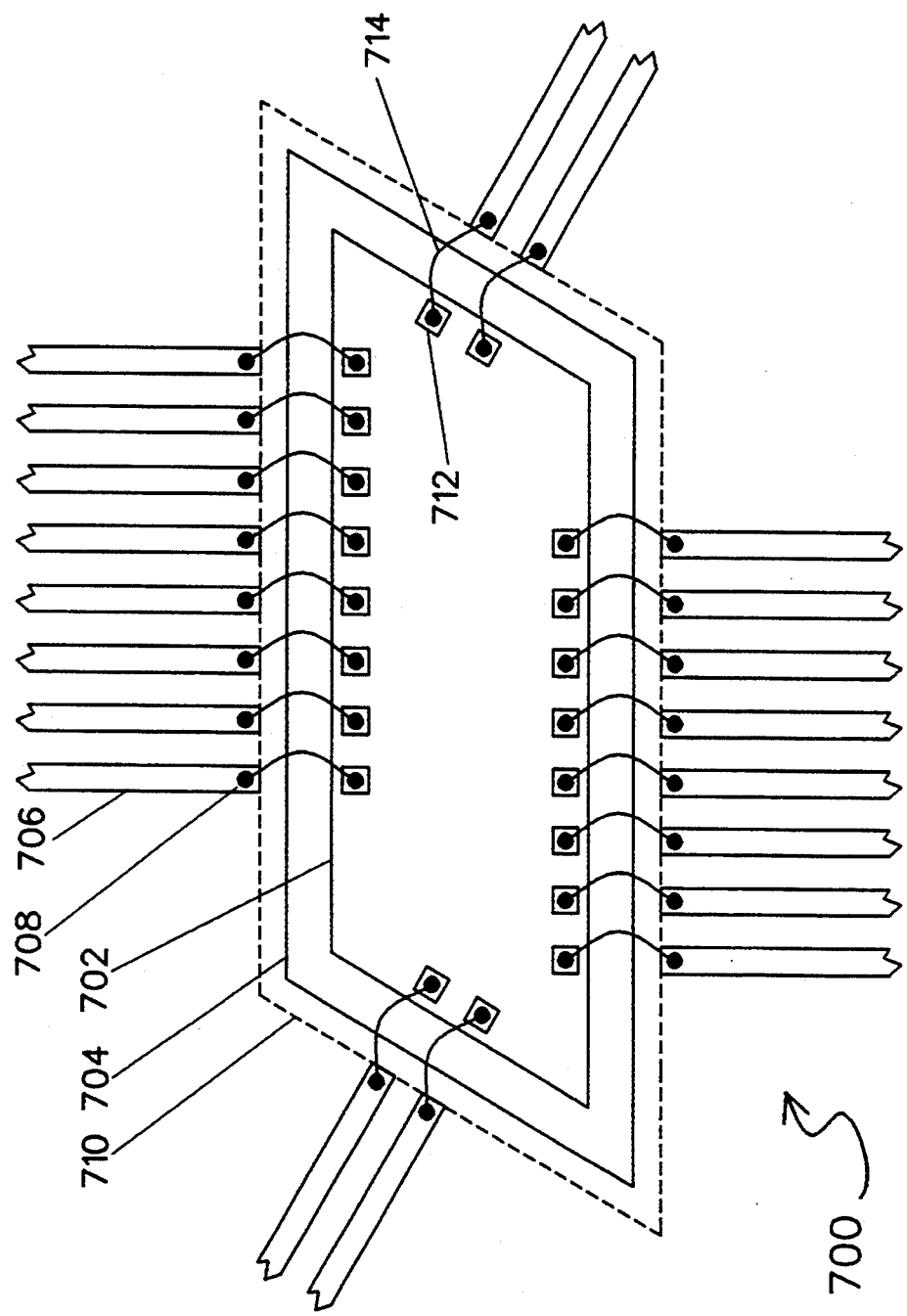
FIG. 7 is a plan view diagrammatic representation of a patterned layer of conductive lines, the inner ends of the conductive lines forming a parallelogram shaped die-receiving area, according to the present invention, and employing a wire bonding technique (by way of example) for connecting a die to the conductive lines.

FIG. 7 shows an alternate embodiment 700 of the present invention, wherein the "certain non-square" die-receiving area is parallelogram shaped. Again, only wire bonding is shown, by way of example.

The parallelogram shaped die-receiving area 710 is defined by the inner ends 708 of conductive lines 706 radiating from the four sides of the die-receiving area. A die 702 is mounted within the die-receiving area 710 and bond pads 712 are connected to the conductive lines 706 by bond wires 714.

The conductive lines 706 include, but are not limited to, lead frame leads (plastic packaging), leads on tape substrates, patterned traces on conductive layers (ceramic packaging), or patterned traces on PCB substrates. As mentioned hereinbefore, there may be a greater number of conductive lines than are shown, the die can be mounted on a die attach pad 404 (preferably conforming to the shape of the die and of the die-receiving area), and the die can be enclosed in a package body (not shown).

The perimeter to area ratio (P:A) for the parallelogram shaped die-receiving area of unit$^2$ area will be 4.56:1, which will accommodate 14% more conductive lines than a similar size prior art (e.g., square) die-receiving area.

Figure 8:
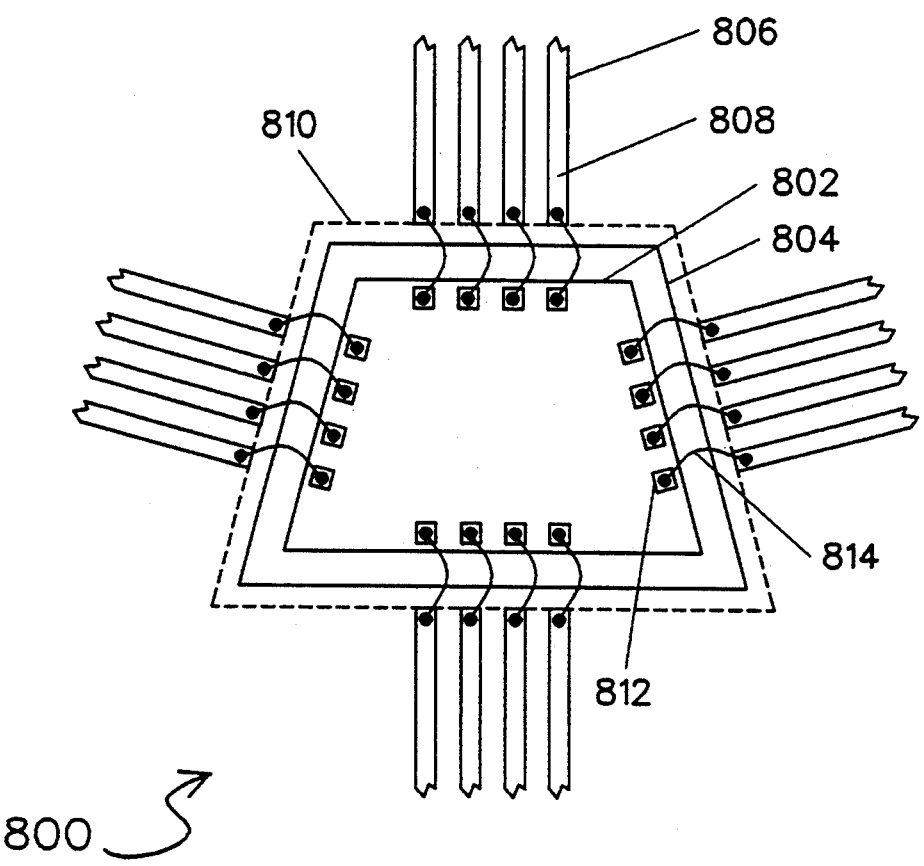
FIG. 8 is a plan view diagrammatic representation of a patterned layer of conductive lines, the inner ends of the conductive lines forming a trapezoidal shaped die-receiving area, according to the present invention, and employing a wire bonding technique (by way of example) for connecting a die to the conductive lines.

FIG. 8 shows an alternate embodiment 800 of the present invention, wherein the "certain non-square" die-receiving area is trapezoidal shaped. Again, only wire bonding is shown, by way of example.

The trapezoidal shaped die-receiving area 810 is defined by the inner ends 808 of conductive lines 806 radiating from the four sides of the die-receiving area. A die 802 is mounted within the die-receiving area 810 and bond pads 812 are connected to the conductive lines 806 by bond wires 814.

The conductive lines 806 include, but are not limited to, lead frame leads (plastic packaging), leads on tape substrates, patterned traces on conductive layers (ceramic packaging), or patterned traces on PCB substrates. As mentioned hereinbefore, there may be a greater number of conductive lines than are shown, the die can be mounted on a die attach pad 805 (preferably conforming to the shape of the die and of the die-receiving area), and the die can be enclosed in a package body (not shown).

The perimeter to area ratio (P:A) for the trapezoidal shaped die-receiving area of unit$^2$ area will greater than for a similar size prior art (e.g., square) die-receiving area.

SEMICONDUCTOR PACKAGE HAVING NON-SQUARE DIE-RECEIVING AREA

FIG. 9 shows plastic molded semiconductor package 900, including one layer of conductive lines defining a "certain non-square" die-receiving area, as set forth above in any of FIGS. 5A, 5B, 6, 7 or 8 (for example). Preferably, the die 902 conforms to the shape of the die-receiving area (i.e., a triangular die in a similar triangular die-receiving area). In this example, the die 902 is mounted to a die attach paddle 904, and is wire bonded (by way of example) to the inner ends 908 of lead frame conductive leads 906. The die 902 and inner portions of the conductive leads 906 are encapsulated in a plastic body 916. Outer portions of the conductive leads extend outside the plastic body for making connections to external systems (not shown).

FIG. 10 shows tape-based semiconductor package 1000, including one layer of conductive lines defining a "certain non-square" die-receiving area, as set forth above in any of FIGS. 5A, 5B, 6, 7 or 8 (for example). Preferably, the die 1002 conforms to the shape of the die-receiving area (i.e., a triangular die in a similar triangular die-receiving area). In this example, the die 1002 is mounted to a die attach pad 1004, and is wire bonded (by way of example) to the inner ends 1008 of conductive leads 1006 supported by an underlying plastic layer 1018. In this example, the die 1002 and inner portions of the conductive leads 1006 are encapsulated in a plastic body 1016, although tape-based packages may be packaged in other manners. Outer portions of the conductive leads extend outside the plastic body for making connections to external systems (not shown).

Figure 11:
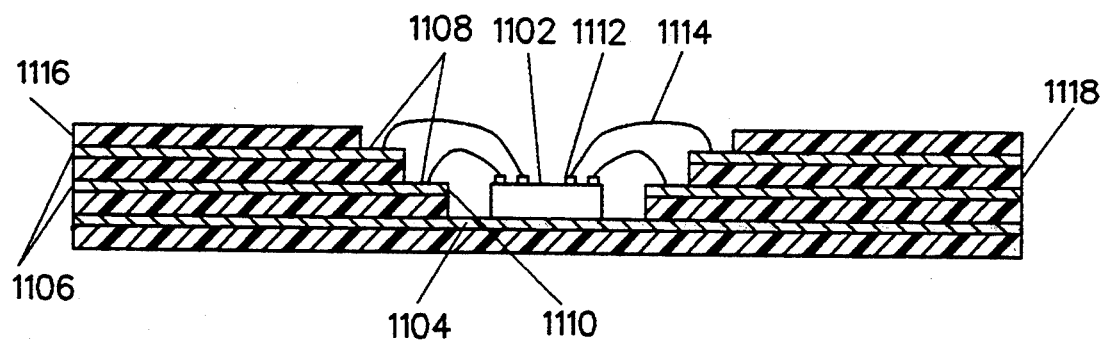
FIG. 11 is a cross-sectional view of a ceramic semiconductor package enclosing a die in the die-receiving area defined by the inner end traces of a conductive layers according to the present invention.

FIG. 11 shows a ceramic semiconductor package 1100, including two layers of conductive lines, each defining a "certain non-square" die-receiving area, as set forth above in any of FIGS. 5A, 5B, 6, 7 or 8 (for example). Preferably, the die 1102 conforms to the shape of the die-receiving areas (i.e., a triangular die in a similar triangular die-receiving area). In this example, the die 1102 is mounted to a die attach area 1104, and is wire bonded (by way of example) to the inner ends 1108 of conductive leads 1106 separated by an interleaved ceramic layer 1118. Wire bonds 1114 connect the die to the inner ends 1108 of the conductive trace 1106. The inner ends 1108 of the conductive traces 1106 define a certain non-square die-receiving area 1110 according to the present invention. The ceramic layer 1118 also defines a similar shaped area. As is evident in FIG. 11, a cavity extends into the surface of the ceramic package. This cavity may be "up" or "down", depending on the orientation of pins, for example (not shown). In a cavity-down ceramic package, pins would be located on the same side of the package as the cavity. The cavity is eventually sealed by a lid (not shown).

Figure 11A:
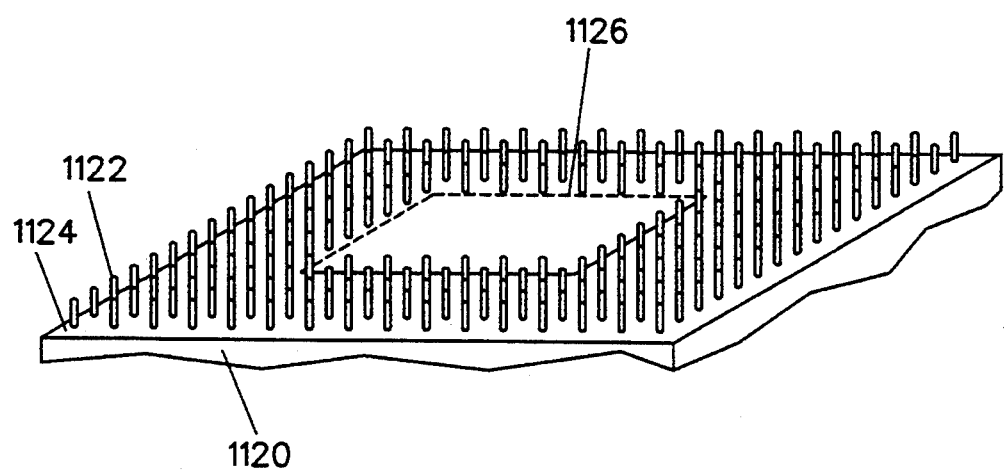
FIG. 11A is a bottom view of a semiconductor package, by way of example the ceramic package of FIG. 11, the ceramic package having a pin grid array for external connections to the package.
Figure 11B:
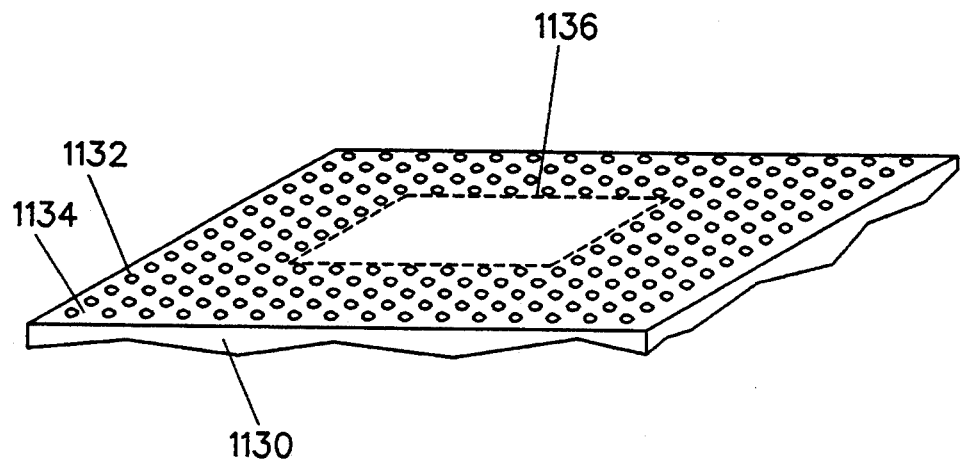
FIG. 11B is a bottom view of a semiconductor package, by way of example the ceramic package of FIG. 11, the ceramic package having a ball bump grid array for external connections to the package.
Figure 11C:
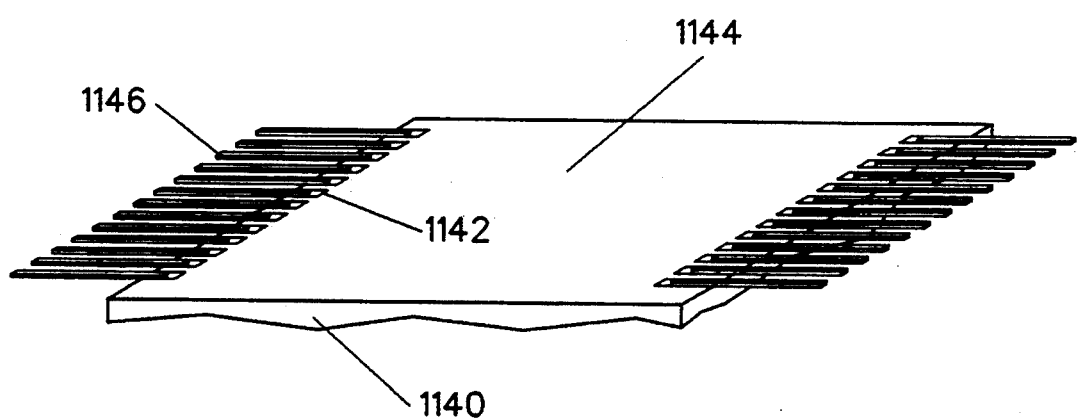
FIG. 11C is a bottom view of a semiconductor package, by way of example the ceramic package of FIG. 11, the ceramic package having external leads providing external connections to the package.

FIGS. 11A–11C illustrate three different bottom views of semiconductor packages.

FIG. 11A shows the bottom side of a generic semiconductor package 1120, ceramic for example, having an array of pins 1122 disposed on an exterior surface 1124 of the package. This is referred to as a "pin grid array". The pins are connected, internally in the package, to the conductive lines (e.g., traces 1106). In the case where the pins 1122 cover substantially the entire surface 1124 of the package 1120, this is referred to as "fully populated". In the case (e.g., cavity down) where there are no pins in a central area 1126 of the exterior surface 1124, this is referred to as "partially populated".

FIG. 11B shows the bottom side of a generic semiconductor package 1130, ceramic for example, having an array of ball bumps 1132 disposed on an exterior surface 1134 of the package. This is referred to as a "ball bump grid array". The ball bumps are connected, internally in the package, to the conductive lines (e.g., traces 1106). In the case where the ball bumps 1132 cover substantially the entire surface 1134 of the package 1130, this is referred to as "fully populated". In the case (e.g., cavity down) where there are no pins in a central area 1136 of the exterior surface 1134, this is referred to as "partially populated".

FIG. 11C shows the bottom side (external surface) of a "generic" semiconductor package 1140, ceramic for example, having bond pads 1142 arranged about the periphery of an exterior surface 1144 of the package. Rigid leads 1146 are bonded to the pads 1142. This is referred to as a "leaded" package. The pads 1142 are connected, internally in the package, to the conductive lines (e.g., traces 1106).

Other packaging techniques, such as tape flat pack are known, and are included within the scope of the invention.

Figure 12:
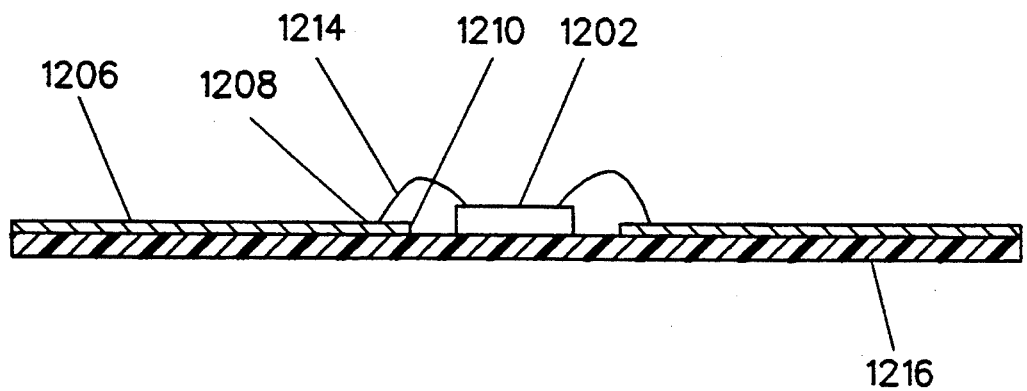
FIG. 12 is a cross-sectional view of a PCB-substrate packaging technique for mounting a die in the die-receiving area defined by inner end conductive layer traces, according to the present invention.

As discussed hereinabove, dies can also be packaged according to PCB-substrate techniques. FIG. 12 shows a certain non-square die 1202 mounted on a printed circuit board substrate 1216, and the die is shown connected with bond wires 1214 to inner ends 1208 of conductive traces 906 on the substrate. The inner ends of the conductive traces define a "certain non-square" die receiving area 1210, as discussed above. As discussed above, the die may be TABbed or flip-chipped to conductive traces on a PCB-substrate. Typically, the die and inner end portions of the traces will be covered (not shown) by glob-top epoxy or covers such as molded plastic, metal, and the like. The PCB-substrate is formed of a suitable insulating material such as FR4 resin, BT resin, teflon or polyimide.

FIGS. 5A, 5B and 6–12 are provided only for illustrative purpose of the teachings of the present invention. They are not intended to limit the invention to the illustrations, rather to provide a sample of an embodiment of the invention. Modifications within the scope of this invention are deemed included.

CERTAIN "NON SQUARE" SEMICONDUCTOR PACKAGING

As discussed hereinabove, "certain non-square" die-receiving areas formed by the inner ends of conductive lines provide for additional I/O connections for a given size die-receiving area, and this principle applies to various types of packaging. It has also been discussed that a die attach pad (if any) would preferably be shaped similar to the die-receiving area defined by the inner ends of the conductive lines. It has also been discussed that the shape defined by the inner ends of the conductive lines is preferably similar to the shape of the die mounted within the die-receiving area.

Figure 13:
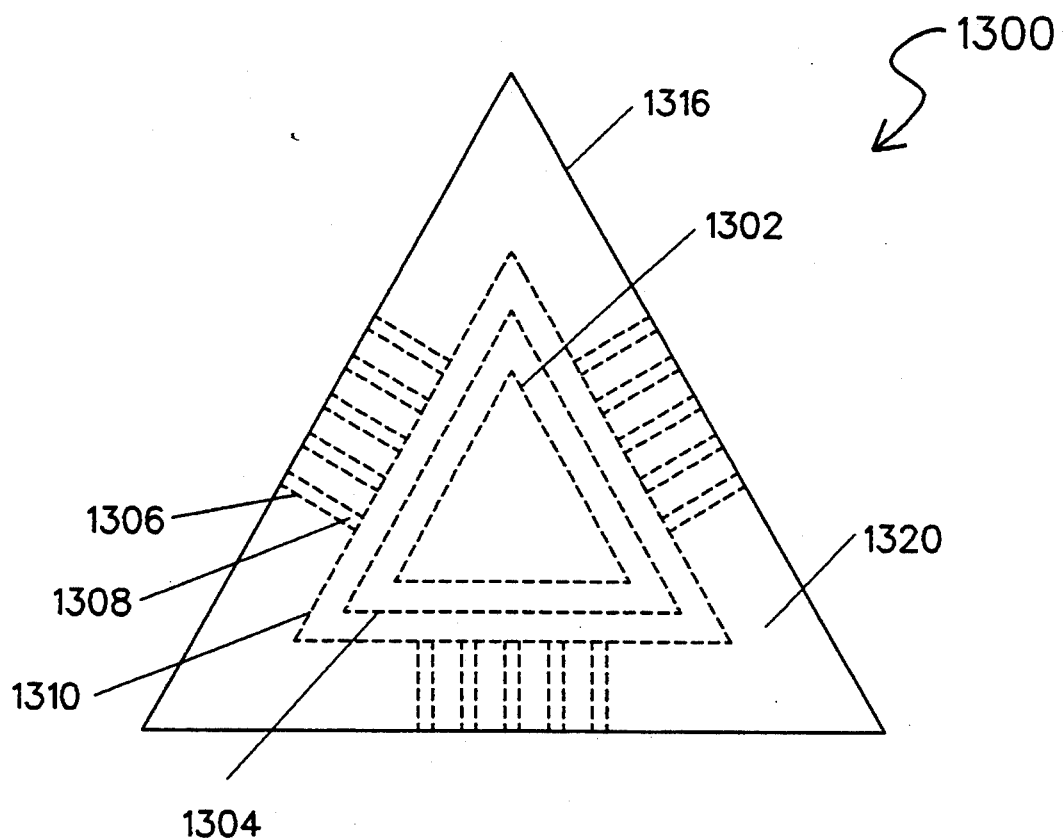
FIG. 13 is a plan view of a semiconductor device assembly, according to the present invention, having a "certain non-square" external configuration, triangular by way of example.

FIG. 13 shows an exemplary semiconductor device assembly 1300, having a "certain non-square" package body 1320—in other words, a "certain non-square" external configuration. Shown in dashed lines are a die 1302, a die attach pad 1004, conductive lines 1306 and inner ends 1308 of the conductive lines, all similar to that shown in FIG. 5A, by way of example. A noteworthy feature of the package body 1320 is that it is preferably shaped similar to the die, die attach pad (if any), and die-receiving area formed by the inner ends of the conductive lines. As shown, all of these elements are triangular, but they could be any of the other "certain non-square" shapes discussed above, employing any of the packaging techniques discussed above, and using any of the techniques for connecting the die to the conductive lines discussed above.

FIGS. 14A, 14B, 14C and 14D illustrate how "certain non-square" packages, for example the package 1300 of FIG. 13, can be laid out on a printed circuit mother board with great efficiency vis-a-vis utilizing the available space on the mother board. This is similar, in some respect, to the wafer-layout-efficiency issue addressed in CNS-DIES (U.S. Ser. No. 916,328).

Figure 14A:
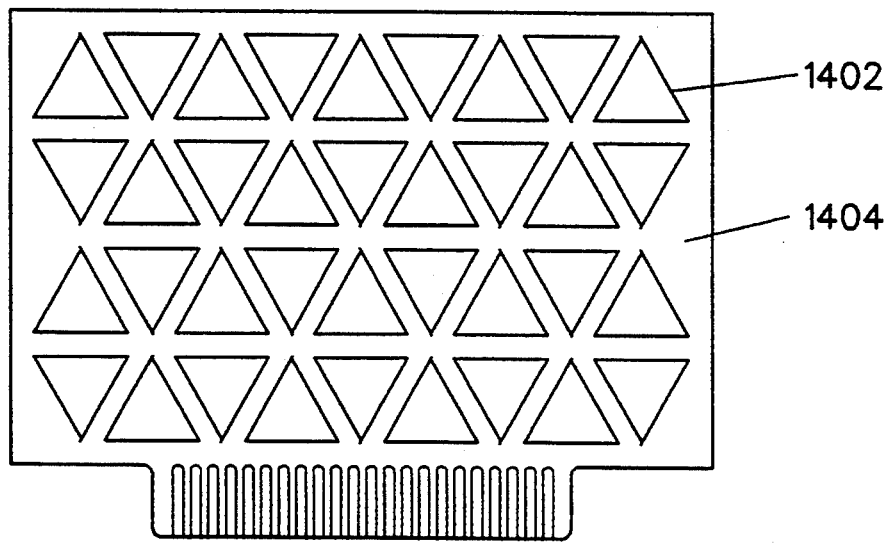
FIG. 14A is a plan view of mounting a number of triangular semiconductor packages on a printed circuit "mother" board, according to the present invention. As employed herein, the term "printed circuit mother board" refers to any circuit board, or the like, used to mount the semiconductor package of the present invention and (usually) other additional electronic components.
Figure 14B:
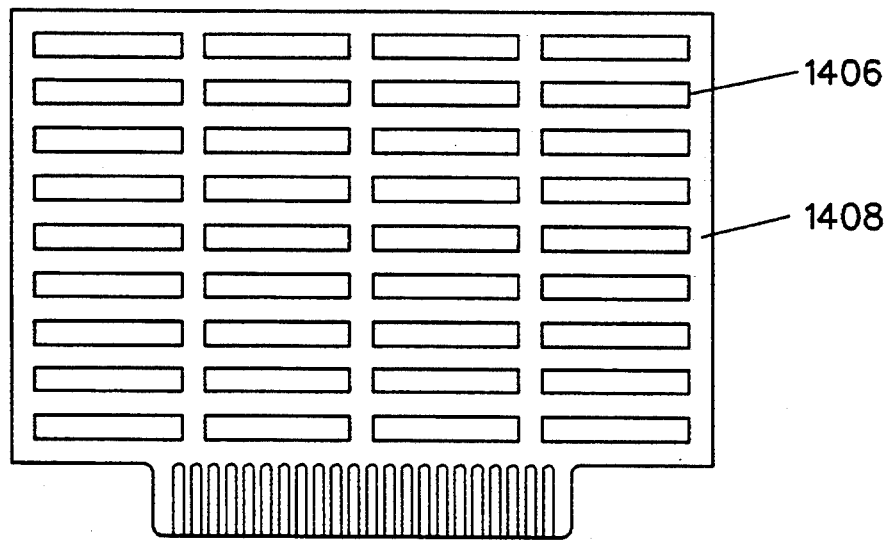
FIG. 14B is a plan view of mounting a number of greatly elongated rectangular semiconductor packages on a printed circuit mother board, according to the present invention.
Figure 14C:
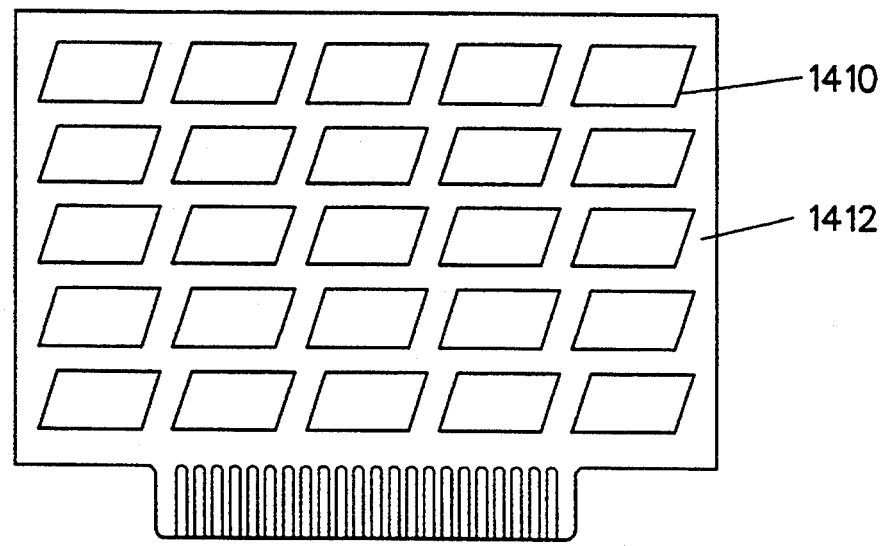
FIG. 14C is a plan view of mounting a number of parallelogram shaped semiconductor packages on a printed circuit mother board, according to the present invention.
Figure 14D:
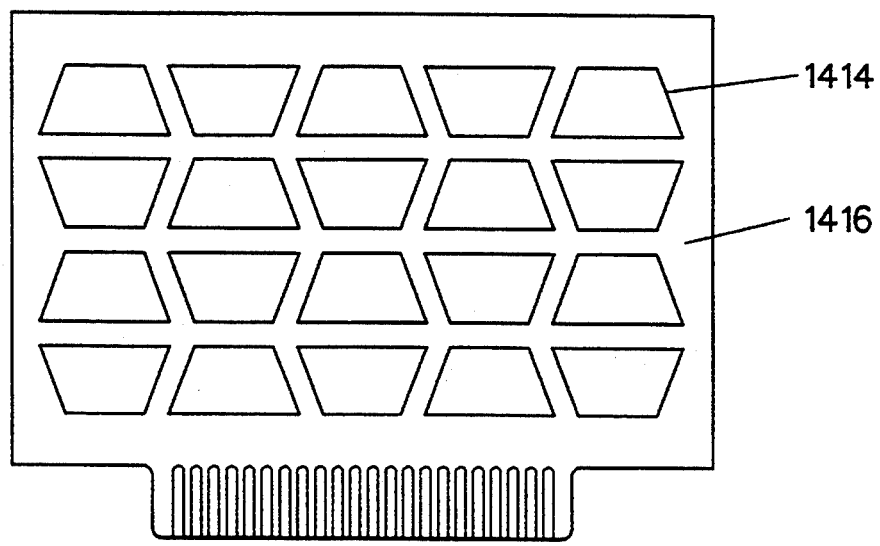
FIG. 14D is a plan view of mounting a number of trapezoidal shaped semiconductor packages on a printed circuit mother board, according to the present invention.

In FIG. 14A, a number of triangular packages 1402 are laid out on a mother board 1404. In FIG. 14B, a number of "greatly elongated rectangular" packages 1406 are laid out on a mother board 1408. In FIG. 14C, a number of parallelogram shaped packages 1410 are laid out on a mother board 1412. In FIG. 14D, a number of trapezoidal shaped packages 1414 are laid out on a mother board 1416. The boards and semiconductor packages of FIGS. 14A–14D are each referred to as an "electronic system".

Figure 14E:
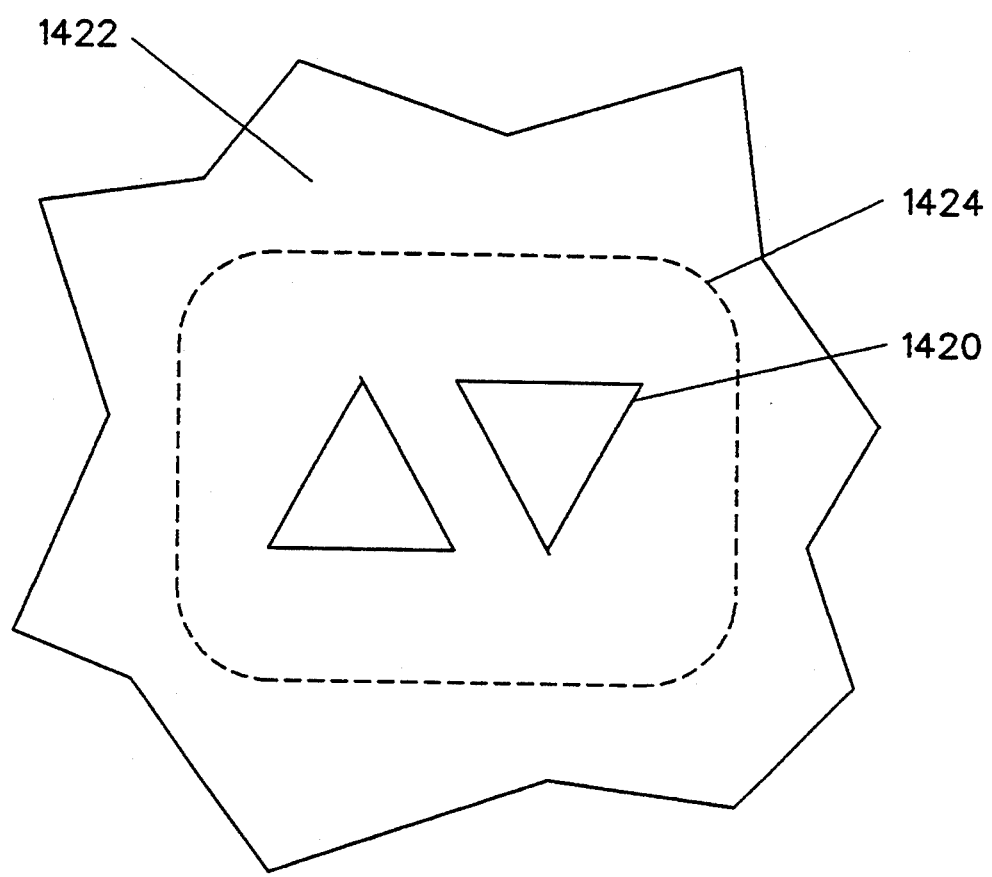
FIG. 14E is a plan view of mounting a number of triangular dies to a printed circuit mother board, forming a "multi-chip module" according to the present invention

FIG. 14E shows a technique similar to that of FIGS. 14A–14D, except that in this case, individual dies 1120 are mounted unpackaged to a substrate 1422 having a series of conductive lines (not shown). As in the previous examples, the inner ends of the conductive lines form "certain non-square" die-receiving areas, and the die is connected to the conductive lines in any suitable manner. The dashed line 1424 indicates that the dies may be globbed over (covered) with epoxy or the like (not shown). In this manner, a "multi-chip module" is formed.

MOLDED CHIP CARRIER PACKAGE FOR CERTAIN NON-SQUARE DIES

Figure 15:
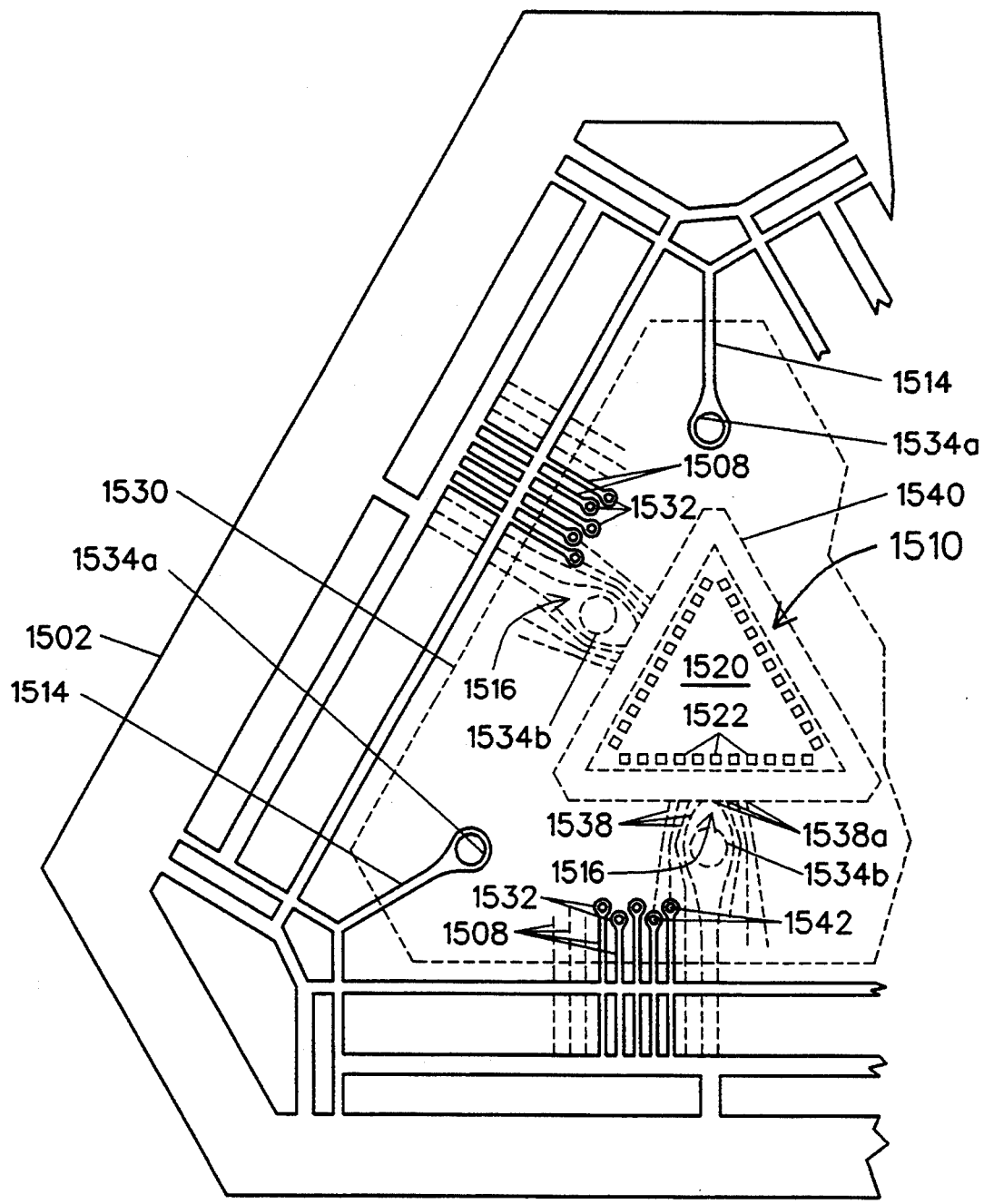
FIG. 15 is a plan view of a leadframe element similar to that shown in FIG. 2, for a package similar to that shown in cross-section in FIGS. 1 or 3, but adapted for a triangular die shape and a triangular package shape, as an example of packaging one configuration of certain non-square dies. Examples for other configurations of certain non-square dies would resemble FIGS. 6, 7 and 8. A cross-section through the finished package of FIG. 15 would yield features similar or identical to those shown in FIGS. 1 or 3.

The chip carrier packages shown and described with respect to FIGS. 1 and 3 are shown in cross-section, with respect to a top view shown in FIG. 2. These embodiments are generally directed to the use of a square or rectangular die. It is possible, however, to use these techniques to provide a chip carrier package for any "certain non-square" die shape, such as those described hereinabove. A plan view of a leadframe for a triangular package of this type is shown with respect to FIG. 15. Although the shape of the package of is different, the sandwich-like construction of the chip carrier of FIG. 15 is identical to that shown and describe with respect to FIG. 1 (or 3). The reference numbers in FIG. 15 are identical to those used in FIGS. 1 and 2, except that number 15xx in FIG. 15 corresponds to 1xx in FIGS. 1 and 2. (FIG. 1 may be used as an additional reference with respect to FIG. 15, provided that the numbering offset is taken into account.)

With particular reference to FIG. 15, the leadframe 1502 is similar to the leadframe shown in FIG. 2, in that it includes a plurality of closely-spaced, fine gauge leads 1508 extending from a central area 1510 to an outer support ring 1512. In this case, however, the central area is triangular. Accordingly, the package shape (shown in outline as 1504, the shape of the upper PCB) is also triangular. A triangular semiconductor die 1520 is disposed within the triangular central area 1510 and is ultimately electrically connected to inner ends of the leads 1508. In a manner similar to that shown and described with respect to FIGS. 1 and 2, the die is connected indirectly through the intermediary of the PCB to the leads 1508, as discussed in greater detail hereinafter. The die 1520 has a lower surface 1520b (refer to the configuration shown in FIG. 1, die 120) which is the "front" side of the die and contains circuit elements (not shown) and bond pads 1522.

As in the embodiment shown in FIGS. 1 and 2, The upper PCB 1504 is formed generally as a ring (a triangular ring in this case, however), having a central opening extending fully through the board. The opening is preferably substantially larger, such as 0.200 inch larger on all sides, than the size of the die 1520.

A number "n" of through holes 1532 are disposed about the periphery of the upper PCB 1504. The number "n" corresponds to the number of leads 1508 in the leadframe, and each through hole 132 is disposed to align with a particular lead 108 of the leadframe.

The through holes 1532 are, if necessary, disposed in two or more offset rows about the periphery of the upper PCB to accommodate the close spacing of the leads. (Two offset rows of holes 1532 are shown in FIG. 15, as in FIG. 2.)

Optionally, as shown, the upper PCB 1504 is also provided with a few additional through holes 1534a, disposed inwardly (nearer the opening 1540) of the through holes 1532. These through holes 1534a are preferably disposed evenly about the upper PCB, taking care to avoid alignment with leads 1508. Rather, they may be aligned with (corner) tiebars 1514 of the leadframe, such as is the case with the corner-aligned through holes 1534a. Or, the leadframe can be modified so that there is a suitable lead-free "void" 1516 aligned with the side edge through holes 1534b.

Similar to the embodiment of FIG. 2, conductors 1538 each extend from a respective through hole 142 towards the inner periphery of the lower PCB, preferably to within 0.010 inches of the opening so as to be adjacent the die 1520. The conductors 1538 are electrically connected to the through holes 1542. A preferred method of making this connection is simply plating the through holes 1542 (and 1532). Inner ends 1538a of the conductors 1538 are left exposed, for connecting to the die 1520. The remaining, outward portions of the conductors 1538 are preferably coated with solder mask material, for purposes of electrical insulation.

The conductors 1538 are laid out (routed) to form a void 1516 for the optional through holes 1534b.

As in the embodiment shown with respect to FIGS. 1 and 2, the die 1520 is mounted to a heat sink and is ultimately encapsulated in a plastic molding compound. As before, the molding of plastic is done around the chip only, and a central portion of the PCB. The molding compound (plastic) does not contact the leadframe, so again there is no need for a dambar, there is no need for removing a dambar, and there is no need for dejunking excess plastic from the leads 1508 or from between leadframe leads. By avoiding a dambar, trimming and dejunking, cost is reduced and closer lead spacing can be achieved.

Although the embodiment of FIG. 15 is shown and described with respect to a triangular die, it will be apparent to one of ordinary skill in the art that this packaging technique is easily adapted to any "certain non-square" die or package shape.

It should be understood that this invention is directed to packaging certain non-square dies in a manner such as is shown in parent U.S. patent application Ser. No. 07/834,182 (e.g., a leadframe sandwiched between two PCBs, with or without a heatsink).

It is within the scope of this invention that the resulting package be provided with ball bumps on an exterior surface, rather than with leads. For example, with reference to FIG. 3, a die 120 is mounted to a PCB substrate 304 through an opening in another PCB 106. A leadframe (plurality of conductive lines) is sandwiched between the inner faces of the PCBs 304 and 106. The die is connected to traces 138 on outer face of the PCB 106. A plastic molded body 170 is formed atop the die and traces on the outer face of the PCB 106. Referring to FIG. 2, it was discussed that through holes 132 are, if necessary, disposed in two or more offset rows about the periphery of the PCBs, and through both PCBs, to make a connection between the traces 138 and the leads of the leadframe. According to an embodiment of the present invention, plated through holes, similar to 132, are provided between the traces 138 on the outer surface of the PCB 106 and a corresponding plurality of leads sandwiched between the PCBs. A corresponding plurality of through holes (not shown) are provided between the plurality of leads sandwiched between the PCBs and points on the outside surface of the PCB 304. These points, where through holes "surface" on the outside surface of the PCB 304 are each provided with a conductive ball bump. In this manner, the entire assembly may be surface mounted to another substrate having a corresponding plurality of similarly-patterned conductive bumps or pads. FIG. 11B is illustrative of providing an array of ball bump contacts on a surface of a package substrate.

What is claimed is:

1. Chip carrier package, comprising:

an upper substrate having an upper surface, a lower surface, and an outline shape;

a lower substrate having an upper surface, a lower surface, and an outline shape;

a "certain non-square" shaped opening extending through the lower substrate;

a leadframe interposed between the lower surface of the upper substrate and the upper surface of the lower substrate, the leadframe contacting the lower surface of the upper substrate and the upper surface of the lower substrate, and having leads extending from an outer periphery of the lower substrate towards the opening in the lower substrate;

wiring traces disposed on the lower surface of the lower substrate, and extending from an outer periphery of the lower substrate to adjacent the opening in the lower substrate, said wiring traces having inner ends adjacent the opening in the lower substrate;

the inner ends of said wiring traces defining a "certain non-square" die-receiving area for mounting a semiconductor die;

a semiconductor die having a front face containing circuit elements and a back face, and mounted in the opening in the lower substrate;

means for electrically connecting the circuit elements to the inner ends of the wiring traces;

means for electrically connecting outer portions of the wiring traces to the leadframe leads; and plastic molding compound disposed over the front face of the die and extending partially over the lower surface of the lower substrate.

2. Chip carrier package, according to claim 1, wherein:

the means for electrically connecting the circuit elements to inner ends of the wiring traces is bond wires.

3. Chip carrier package, according to claim 1, wherein:

the means for electrically connecting the outer portions of the wiring traces to the leadframe leads is at least one row of plated through holes extending through outer peripheral portions of the upper and lower substrates.

4. Chip carrier package, according to claim 3, wherein:

at least two rows of plated through holes are disposed about the outer peripheral portions of the upper and lower substrates, and each row of through holes is offset from the remaining rows of plated through holes.

5. Chip carrier package, according to claim 3, further comprising:

additional through holes extending through the upper and lower substrates;

wherein:

the additional through holes are plated; and the additional through holes are electrically isolated from the leadframe leads.

6. Chip carriers package, according to claim 1, wherein:

the upper substrate is provided with a central opening;

a heatsink element is disposed within the central opening in the upper substrate; and the back face of the semiconductor die is adhered to the heatsink.

7. Chip carrier package, according to claim 1, wherein:

the back face of the semiconductor die is adhered to the lower surface of the upper substrate.

8. Chip carrier package, according to claim 1, wherein:

the die-receiving area has a certain non-square geometric configuration similar to a geometric configuration of a certain non-square die mounted in the die-receiving area.

9. Chip carrier package, according to claim 1, wherein:

the geometric configuration formed by the inner ends of the wiring traces defines a triangular shaped die-receiving area.

10. Chip carrier package, according to claim 1, wherein:

the geometric configuration formed by the inner ends of the wiring traces defines a "greatly elongated rectangular" shaped die-receiving area.

11. Chip carrier package, according to claim 1, wherein:

the geometric configuration formed by the inner ends of the wiring traces defines a parallelogram shaped die-receiving area.

12. Chip carrier package, according to claim 1, wherein:

the geometric configuration formed by the inner ends of the wiring traces define a trapezoidal shaped die-receiving area.

13. Chip carrier package, according to claim 1, further comprising:

a "certain non-square" body shape defined by the outlines of the upper and lower substrates.

14. Chip carrier package, according to claim 13, wherein:

the body shape is triangular.

15. Chip carrier package, according to claim 13, wherein:

the body shape is a "greatly elongated rectangular" shape.

16. Chip carrier package, according to claim 13, wherein:

the body shape is a parallelogram shape.

17. Chip carrier package, according to claim 13, wherein:

the body shape is a trapezoidal shape.

18. Chip carrier comprising:

an upper substrate having an upper surface, a lower surface, and an outline;

a lower substrate having an upper surface, a lower surface, and an outline;

a "certain non-square" shaped opening extending through the lower substrate for receiving a semiconductor die;

a leadframe interposed between the lower surface of the upper substrate and the upper surface of the lower substrate, the leadframe contacting the lower surface of the upper substrate and the upper surface of the lower substrate, and having leads extending from an outer periphery of the lower substrate towards the opening in the lower substrate;

wiring traces disposed on the lower surface of the lower substrate, and extending from an outer periphery of the lower substrate to adjacent the opening in the lower substrate, said wiring traces having inner ends adjacent the opening in the lower substrate;

the inner ends of said wiring traces defining a "certain non-square" die-receiving area for mounting a semiconductor die; and means for electrically connecting outer portions of the wiring traces to the leadframe leads;

wherein:

a completed package is formed by mounting a die in the opening, connecting the die to the inner ends of the wiring traces and disposing plastic molding compound over the die and partially over the lower surface of the lower substrate.

* * * * *